(12) United States Patent
Ikeda

(10) Patent No.: US 11,328,659 B2
(45) Date of Patent: May 10, 2022

(54) DISPLAY DEVICE

(71) Applicant: Japan Display Inc., Tokyo (JP)

(72) Inventor: Masanobu Ikeda, Tokyo (JP)

(73) Assignee: JAPAN DISPLAY INC., Tokyo (JP)

(*) Notice: Subject to any disclaimer, the term of this patent is extended or adjusted under 35 U.S.C. 154(b) by 0 days.

(21) Appl. No.: 17/238,216

(22) Filed: Apr. 23, 2021

(65) Prior Publication Data

US 2021/0358392 A1 Nov. 18, 2021

(30) Foreign Application Priority Data

May 15, 2020 (JP) .............................. JP2020-086041

(51) Int. Cl.
*G09G 3/32* (2016.01)
*H01L 25/16* (2006.01)
*G09G 3/20* (2006.01)

(52) U.S. Cl.
CPC .............. *G09G 3/32* (2013.01); *G09G 3/2022* (2013.01); *H01L 25/167* (2013.01); *G09G 2300/0426* (2013.01); *G09G 2310/0267* (2013.01); *G09G 2320/0242* (2013.01); *G09G 2320/045* (2013.01); *G09G 2320/064* (2013.01); *G09G 2360/16* (2013.01)

(58) Field of Classification Search
CPC ...... G09G 3/2022; G09G 3/2074; G09G 3/32; G09G 3/3208; G09G 2320/0242; G09G 2320/045; G09G 2320/064; G09G 2360/16; G09G 2300/0426; G09G 2300/0439; G09G 2300/0443; G09G 2310/0267; H01L 25/167
USPC ................................................... 345/691, 76
See application file for complete search history.

(56) References Cited

U.S. PATENT DOCUMENTS

| 10,629,573 | B2 * | 4/2020 | Perala ................... H01L 27/156 |
| 11,037,912 | B1 * | 6/2021 | Meitl ................... H01L 25/0753 |
| 2019/0302496 | A1 | 10/2019 | Okuyama | |

FOREIGN PATENT DOCUMENTS

JP 2019-174531 A 10/2019

* cited by examiner

*Primary Examiner* — Jason M Mandeville
(74) *Attorney, Agent, or Firm* — Xsensus LLP

(57) ABSTRACT

A display device comprises a plurality of pixels arranged in a first direction and a second direction intersecting the first direction, a plurality of sub-pixels included in each of the plurality of pixels, a first LED chip included in one of the plurality of sub-pixels and emitting light at a first luminosity L1, a second LED chip included in the one of sub-pixel and emitting light at a second luminosity L2, a first wiring supplying a first voltage corresponding to the first luminosity L1 to the first LED chip, a second wiring supplying a second voltage corresponding to the second luminosity L2 to the second LED chip. The first luminous intensity L1 of the first LED chip is calculated based on an equation (1) using a chip area S1 and a luminance EQEL1 of the first LED chip, $$L1 = S1 \times EQEL1 \tag{1}$$

7 Claims, 15 Drawing Sheets

DISPLAY DEVICE

CROSS-REFERENCE TO RELATED APPLICATIONS

This application is based upon and claims the benefit of priority from the prior Japanese Patent Application No. 2020-086041, filed on May 15, 2020, the entire contents of which are incorporated herein by reference.

FIELD

An embodiment of the present invention relates to a display device.

BACKGROUND

A display device in which each of a plurality of pixels is formed by a light-emitting element has attracted attention in recent years. The light-emitting element is, for example, a Light-emitting Diode (LED), a micro light-emitting diode (micro-LED), an Electro Luminescence (EL) element, and the like. Light emission intensity or luminance of the light-emitting element is controlled by a current flowing through the light-emitting element. In a display device including a plurality of pixels is formed by the light-emitting element, the technique of an area gradation is one of the techniques for displaying gradation.

For example, Japanese laid-open patent publication No. 2019-174531 discloses a display device in which each of a plurality of pixels has two organic EL elements differing in area. Japanese Patent laid-open patent publication No. 2019-174531 discloses a display device disclosed that uses an area gradation technique changing a light emitting area of organic EL elements light as a gray scale displaying technology. A display device described in Japanese Patent laid-open patent publication No. 2019-174531 has two OLED elements with different areas each other, controls light emission and non-light emission in each of two organic EL elements differing in area.

SUMMARY

A display device according to one embodiment includes a plurality of pixels arranged in a first direction and a second direction intersecting the first direction, a plurality of sub-pixels included in each of the plurality of pixels, a first LED chip included in one of the plurality of sub-pixels and emitting light at a first luminosity L1, a second LED chip included in the one of sub-pixel and emitting light at a second luminosity L2, a first wiring supplying a first voltage corresponding to the first luminosity L1 to the first LED chip, and a second wiring supplying a second voltage corresponding to the second luminosity L2 to the second LED chip. The first luminous intensity L1 of the first LED chip is calculated based on an equation (1) using a chip area S1 and a luminance EQEL1 of the first LED chip, $$L1 = S1 \times EQEL1 \quad (1).$$

The second luminous intensity L2 of the second LED chip is calculated based on an equation (2) using a chip area S2 and a luminance EQEL2 of the second LED chip, $$L2 = S2 \times EQEL2 \quad (2).$$

The luminance EQEL1 is the luminance of the first LED chip when the first LED chip emits light at a current density maximizing an external quantum efficiency, the luminance EQEL2 is the luminance of the second LED chip when the second LED chip emits light at a current density maximizing an external quantum efficiency, the chip area S1 is a factorial of 2 of the chip area S2, and the first voltage is different from the second voltage.

DESCRIPTION OF EMBODIMENTS

Figure 1:
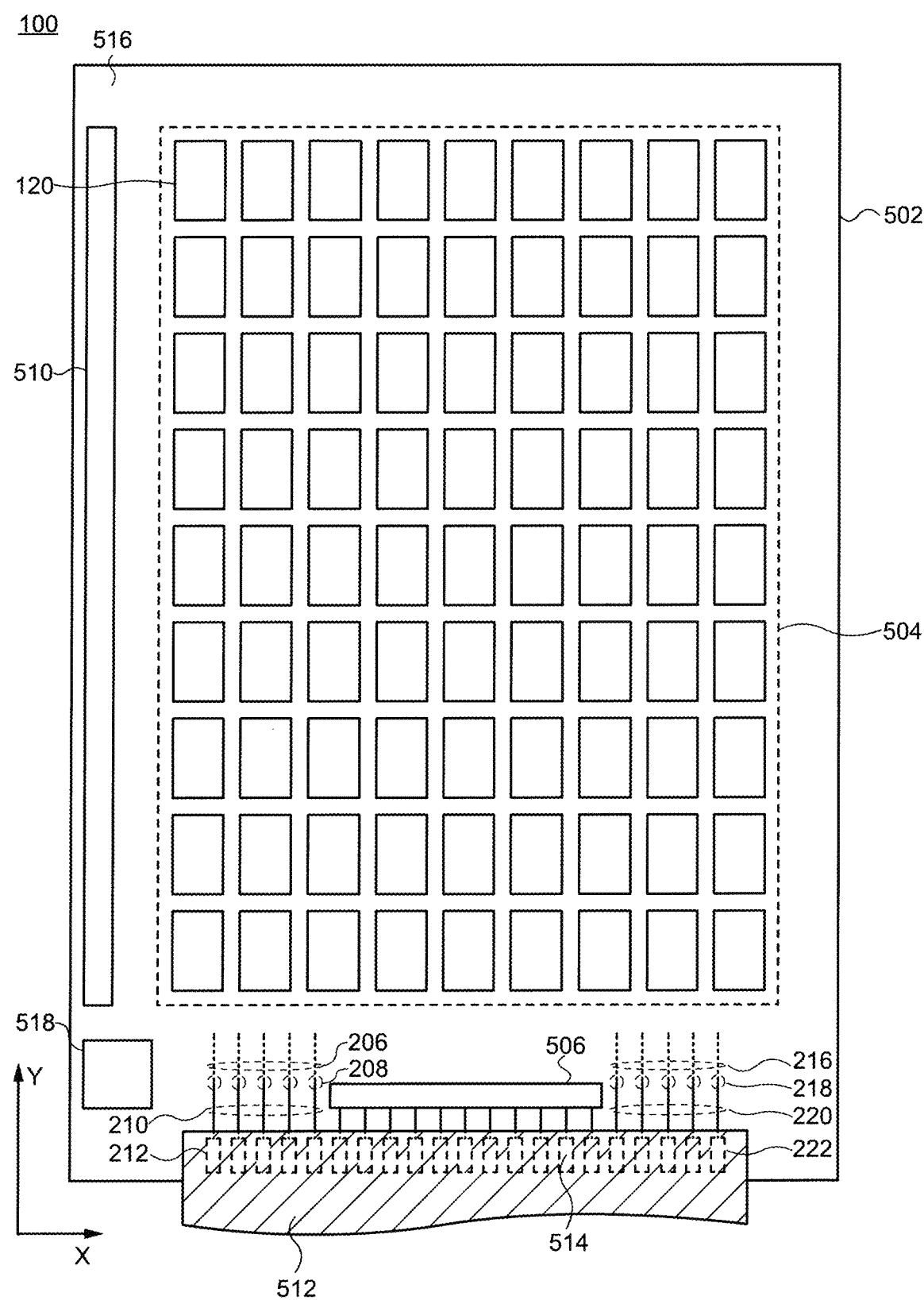
FIG. 1 is a schematic plan view showing a configuration of a display device according to an embodiment.

An embodiments are explained below while referring to diagrams and the like. However, the present disclosure can be implemented in many different modes, and should not be interpreted as being limited to the description of the embodiments exemplified below.

In addition, although the diagrams may be schematically represented with respect to each part's configurations as compared with actual embodiments in order to make explanation clearer, it is only an example and an interpretation of the present disclosure is not limited.

Furthermore, in the present specification and each diagram, the same reference numerals (or reference numerals such as a, b, A, B and the like attached after a numeral) are given to the same elements as those described above with reference to the preceding diagrams, and detailed description thereof may be omitted as appropriate. The letters "first" and "second" to each element are convenient labels used to distinguish each element and have no further meaning unless otherwise explained.

In the present specification, one member or region may be "above (or below)" of another member or region. Unless otherwise limited, this includes not only the case of one member or region being directly above (or below) another member or region, but also the case of one member or region being above (or below) another member or region, that is, this also includes the case where other components is included between one member or region and above (or below) another member or region. In the following description, unless otherwise specified, in the cross sectional view, the side on which display element is arranged with respect to substrate is referred to as the "upper plane" and the opposite is referred to as the "lower plane".

The expressions "a includes A, B or C", "a includes any of A, B and C", "a includes one selected from a group consisting of A, B and C", unless otherwise specified, do not exclude a case where a includes multiple combinations of A to C. Furthermore, these expressions do not exclude a case where a includes other elements.

A substrate described herein has at least one planar main surface. Respective layers of an insulating layer, a semiconductor layer and a conductive layer, or respective elements such as a transistor and a light-emitting element are provided on the at least one planar main surface. In the following explanation, the at least one planar main surface of a substrate is used as a reference in a cross-sectional view.

A display device, which is one of the embodiments of the present disclosure, is, for example, a display device using a micro-LED for a light-emitting element.

When a light-emitting element constituting a display device is, for example, an LED including a micro-LED, an optimal quantum-efficiency of the LED depends on a size of the LED. For example, driving a plurality of LEDs with different areas at the same current-density, the chromaticity of each of the plurality of LEDs may result in differences. Consequently, the differences in lifetimes of the plurality of LEDs may affect long-term reliability of the display device.

In view of the above problems, it is an object of one embodiment of the present disclosure to provide a display device for reducing a decrease in long-term reliability.

In some embodiments shown below, a configuration of a display device according to an embodiment of the present invention will be exemplified.

<1. Overall Configuration of Display Device 100>

Figure 2:
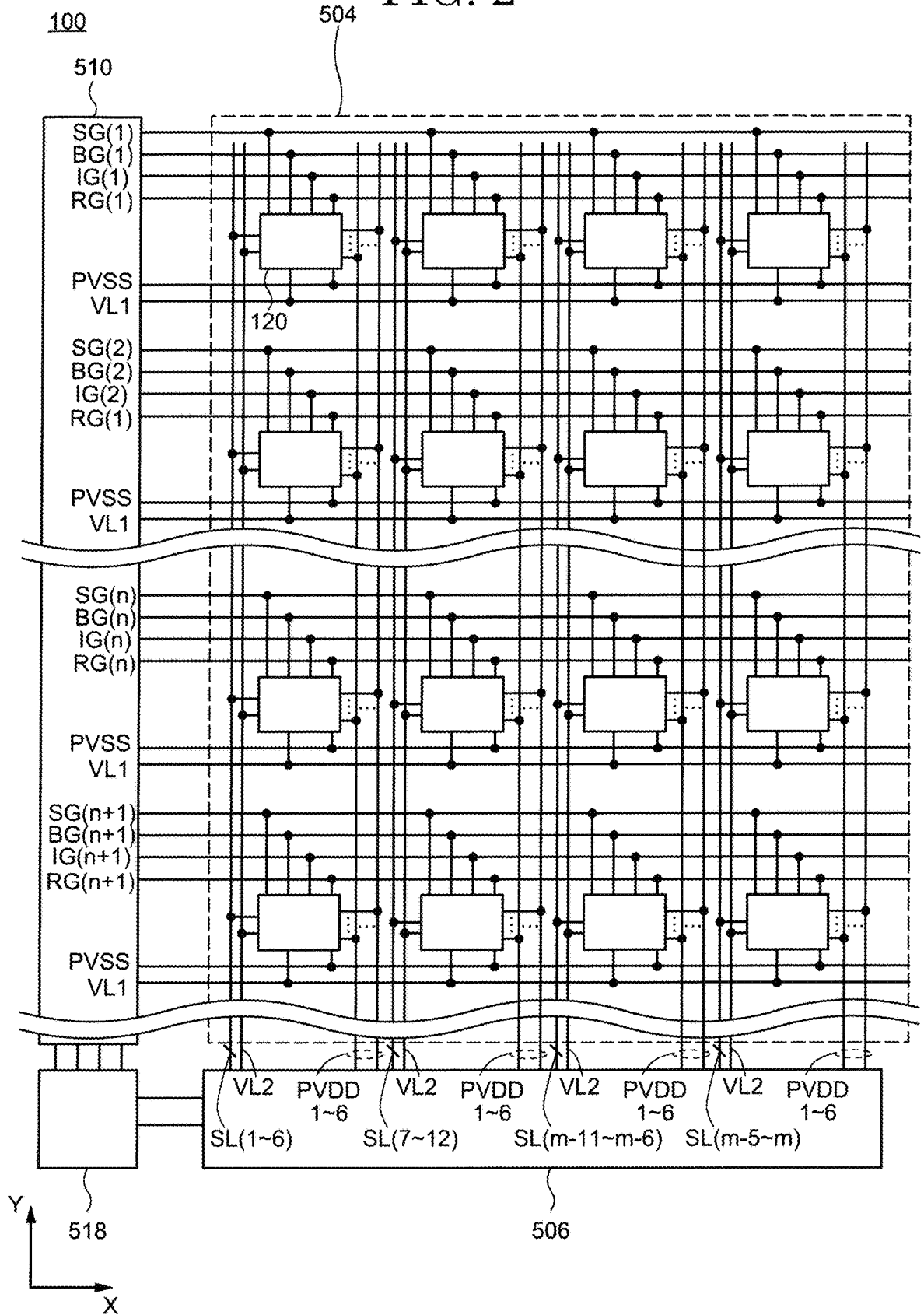
FIG. 2 is a schematic plan view showing a configuration of a display device according to an embodiment.

FIGS. 1 and 2 are schematic plan views showing a configuration of a display device 100 according to an embodiment. The configuration of the display device 100 shown in FIGS. 1 and 2 is merely an example, and the configuration of the display device 100 is not limited to the configuration shown in FIGS. 1 and 2.

As shown in FIG. 1, the display device 100 has a substrate 502, a display 504, a video signal line drive circuit 506, a scanning signal line drive circuit 510, a control circuit 518, a terminal electrode 514, and a peripheral area 516. The display 504, the video signal line drive circuit 506, the scanning signal line drive circuit 510, the control circuit 518, the terminal electrode 514, and the peripheral area 516 are provided on a top surface of the substrate 502. The display 504 has a plurality of pixels 120 for displaying an image on the display device 100.

Figure 4:
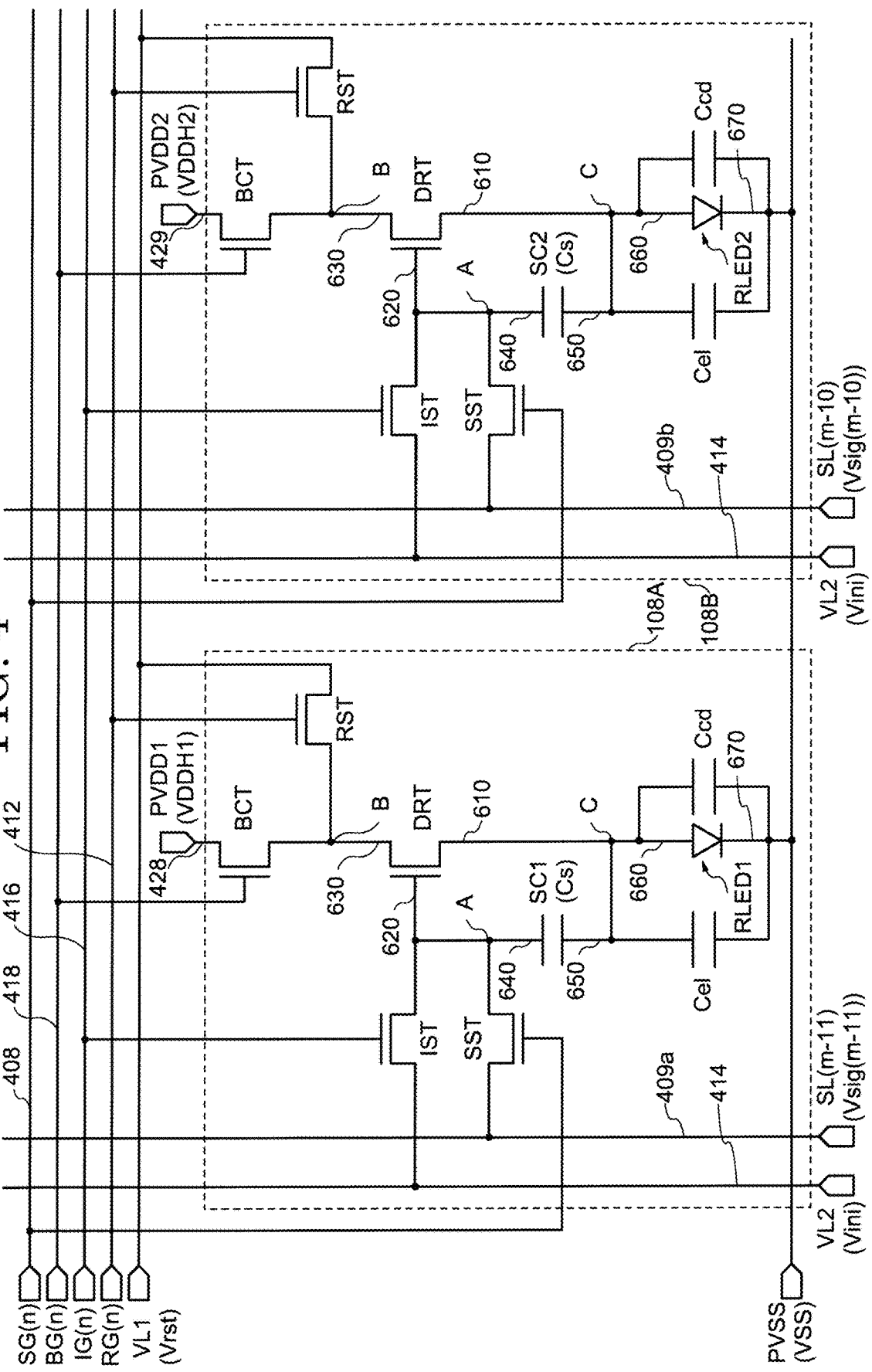
FIG. 4 is a circuit diagram showing a circuit configuration of a sub-pixel according to an embodiment.

The plurality of pixels 120 are arranged in a matrix in x-direction and y-direction intersecting in the x-direction. Each of the plurality of pixels 120 includes a plurality of sub-pixels (FIG. 4), each of the plurality of sub-pixels has at least a transistor (FIG. 4) and a first light-emitting element (FIG. 4) and a second light-emitting element (FIG. 4). The first light-emitting element emits at a first luminous intensity and the second light-emitting element emits at a second luminous intensity. An area of the second light-emitting element is smaller than an area of the first light-emitting element. The display device 100 according to an embodiment may drive the transistor to emit or not emit the LED, thereby the display device 100 may display an image on the display 504. In an embodiment, for example, the x-direction is referred to as a first direction, the y-direction is referred to as a second direction, and the light-emitting element is referred to as an LED-chip. Details of the pixel 120, the sub-pixel, and the light-emitting element will be described later.

In the peripheral area 516, the scanning signal line drive circuit 510 and the video signal line drive circuit 506 are provided to control the driving of the pixels 120. In FIG. 1, an example of using an IC-chip as the video signal line drive circuit 506 is shown. In FIG. 2, an example is shown in which the scanning signal line drive circuit 510 and the video signal line drive circuit 506 are provided on the top surface of the substrate 502. The scanning signal line drive circuit 510 and the video signal line drive circuit 506 are not limited to the examples shown in FIGS. 1 and 2. For example, drive circuits formed on a different substrate (such as a semiconductor substrate) than the substrate 502 as both the scanning signal line drive circuit 510 and the video signal line drive circuit 506 may be provided on the substrate 502 or a connector 512 as a flexible printed circuit (FPC) substrate. A part or all of the circuit of the scanning signal line drive circuit 510 and the video signal line drive circuit 506 may be formed on a substrate different from the substrate 502, and the substrate different from the substrate 502 may be provided on the substrate 502 or the connector 512. The drive circuit or a part of the drive circuit included in the video signal line drive circuit 506 may be directly formed on the substrate 502. As will be described later, on the upper surface of the substrate 502, the light-emitting element (LED) provided in the pixel 120, and various semiconductor elements for controlling the light-emitting element are formed.

The display device 100 has a first wiring 206, a contact hole 208, a first electrode wiring 210, a first electrode 212, a second wiring 216, a contact hole 218, a second electrode wiring 220, and a second electrode 222. These are provided on the top surface of the substrate 502, similar to the scanning signal line drive circuit 510.

Although not shown in FIG. 1, for example, a video signal line for supplying a video signal to each pixel 120, a power line for supplying power to each pixel 120, the scanning signal line drive circuit 510, and the control circuit 518 are electrically connected to the first wiring 206 extending from the outside of the display 504. The first wiring 206 extends outside the display 504 and is electrically connected to the first electrode wiring 210 via the contact hole 208. The first electrode wiring 210 is exposed near an end of the display device 100 to form the first electrode 212. The first electrode 212 is connected to the connector 512.

Although not shown in FIG. 1, similarly, for example, a video signal line for supplying a video signal to each pixel 120, a power line for supplying power to each pixel 120, the scanning signal line drive circuit 510, and the control circuit 518 are electrically connected to the second wiring 216 extending from the outside of the display 504. The second wiring 216 extends outside the display 504 and is electrically connected to the second electrode wiring 220 via the contact hole 218. The second electrode wiring 220 is exposed near the end of the display device 100 to form the second electrode 222. The second electrode 222 is connected to the connector 512. The second wiring 216 may be the first wiring 206. The contact hole 218 may be the contact hole 208. The second electrode wiring 220 may be the first electrode wiring 210. The second electrode 222 may be the first electrode wiring 210. The second electrode 222 may be the first electrode 212.

Each of signals and power sources are supplied from an external circuit (not shown) via the first electrode 212, the scanning signal line drive circuit 510, and the video signal line drive circuit 506 to the pixel 120. The first electrode 212 may be formed to align on one side of the display device 100. Thus, the single connector 512 can be used to independently provide voltages and signals to the display 504.

As shown in FIG. 2, the control circuit 518 is supplied with video signals, timing signals for controlling the operation of the circuit, and power supply voltages from an external circuit (not shown) via a plurality of terminal electrodes 514 (FIG. 1). The control circuit 518 supplies the scanning signal line drive circuit 510 and the video signal line drive circuit 506 with each of signals and power supply voltages, and the like. With using a logic circuit (not shown) or a voltage generation circuit (not shown) of the control circuit 518, the control circuit 518 generates new signals or power supply voltages with using the respective signal or power supply voltages. The new signals and the new power supply voltages may be supplied to the scanning signal line drive circuit 510 or the video signal line drive circuit 506. In addition, the position at which the control circuit 518 is arranged is not limited to the location on the substrate 502 shown in FIG. 1. For example, the control circuit 518 may be located on the connector 512 connected to the terminal electrode 514.

The scanning signal line drive circuit 510 and the video signal line drive circuit 506 use each of signals and power supply voltages supplied from the control circuit 518 to drive the transistors (FIG. 4) of the pixel 120 and emit or non-emit the LED (FIG. 4), thereby serving to display an image on the display 504.

The scanning signal line drive circuit 510 supply a scanning signal SG (n), a light emission control signal BG (n), an initialization control signal IG (n), and a first reset signal RG (n) commonly to the plurality of pixels 120 located on the n-th line in the display 504. In this case, the first reset signal RG (n) supplies a voltage Vrst to the plurality of pixels 120 located on the n-th line in the display 504. A reference potential line PVSS supplies a reference potential VSS commonly to the plurality of pixels 120. A reset signal VL1 supplies the voltage Vrst commonly to the plurality of pixels 120.

The video signal line drive circuit 506 supplies a video signal SL (m) and a second reset signal VL2 commonly to the plurality of pixels 120 located on the m-th column in the display 504. The second reset signal VL2 here supplies a voltage Vini to the plurality of pixels 120 located on the m-th column in the display 504. A first drive power line PVDD1 supplies a first drive voltage VDDH1 to the plurality of pixels 120 located on the m-th column in the display 504. A second drive power line PVDD2 supplies a second drive voltage VDDH2 to the plurality of pixels 120 located on the m-th column in the display 504. A third drive power line PVDD3 supplies a third drive voltage VDDH3 to the plurality of pixels 120 located on the m-th column in the display 504. A fourth drive power line PVDD4 supplies a fourth drive voltage VDDH4 to the plurality of pixels 120 located on the m-th column in the display 504. A fifth drive power line PVDD5 supplies a fifth drive voltage VDDH5 to the plurality of pixels 120 located on the m-th column in the display 504. A sixth drive power line PVDD6 supplies a sixth drive voltage VDDH6 to the plurality of pixels 120 located on the m-th column in the display 504. Hereinafter, the voltage of the video signal is referred to as Vsig (m), or Vsig (n). The video signal is a signal based on a video data displayed by the display 504. In an embodiment, the value m is any integer greater than or equal to 12. In an embodiment, the value n is any integer greater than or equal to 1. In an embodiment, the first drive power line PVDD1, the third drive power line PVDD3, the fifth drive power line PVDD5 may be referred to as the first wiring, the second drive power line PVDD2, the fourth drive power line PVDD4, the sixth drive power line PVDD6 may be referred to as the second wiring.

In an embodiment, the voltage Vrst and the voltage Vini are fixed voltages, but the voltage Vrst and the voltage Vini may change over time. In an embodiment, the scanning signal line drive circuit 510 supplies the first reset signal RG to the plurality of pixels 120, the video signal line drive circuit 506 supplies the second reset signal VL2 to the plurality of pixels 120, but the one embodiment of the present invention is not limited to this embodiment. The video signal line drive circuit 506 may supply the first reset signal RG to the plurality of pixels 120, and the scanning signal line drive circuit 510 may supply the second reset signal VL2 to the plurality of pixels 120. Either of the scanning signal line drive circuit 510 and the video signal line drive circuit 506 may supply the first reset signal RG and the second reset signal VL2 to the plurality of pixels 120. The first reset signal RG and the second reset signal line VL2 may be electrically connected to the terminal electrode 514. In this case, the voltage Vrst and the voltage Vini are supplied via the connector 512 from an external device provided outside of the display device 100 (not shown). In an embodiment, the voltage Vrst may be referred to as a reset voltage. In an embodiment, the voltage Vini may be referred to as an initialization voltage.

In an embodiment, the first drive power line PVDD1, the second drive power line PVDD2, the third drive power line PVDD3, the fourth drive power line PVDD4, the fifth drive power line PVDD5, and the sixth drive power line PVDD6 are provided in the video signal line drive circuit 506, the first drive voltage VDDH1, the second drive voltage VDDH2, the third drive voltage VDDH3, the fourth drive voltage VDDH4, the fifth drive voltage VDDH5, and the sixth drive voltage VDDH6 are provided from the video signal line drive circuit 506 to each pixel 120, but the one embodiment of the present invention is not limited to this example. The first drive power line PVDD1, the second drive power line PVDD2, the third drive power line PVDD3, the fourth drive power line PVDD4, the fifth drive power line PVDD5, and the sixth drive power line PVDD6 may be provided in the scanning signal line drive circuit 510, a part of the first drive voltage VDDH1, the second drive voltage VDDH2, the third drive voltage VDDH3, the fourth drive voltage VDDH4, the fifth drive voltage VDDH5, and the sixth drive voltage VDDH6 is provided in the scanning signal line drive circuit 510, other than a part may be provided in the video signal line drive circuit 506. In the display device 100 according to an embodiment, arrangement of the power lines may be appropriately changed in accordance with the use, specifications, and the like.

<2. Configuration of Pixel 120>

Figure 3:
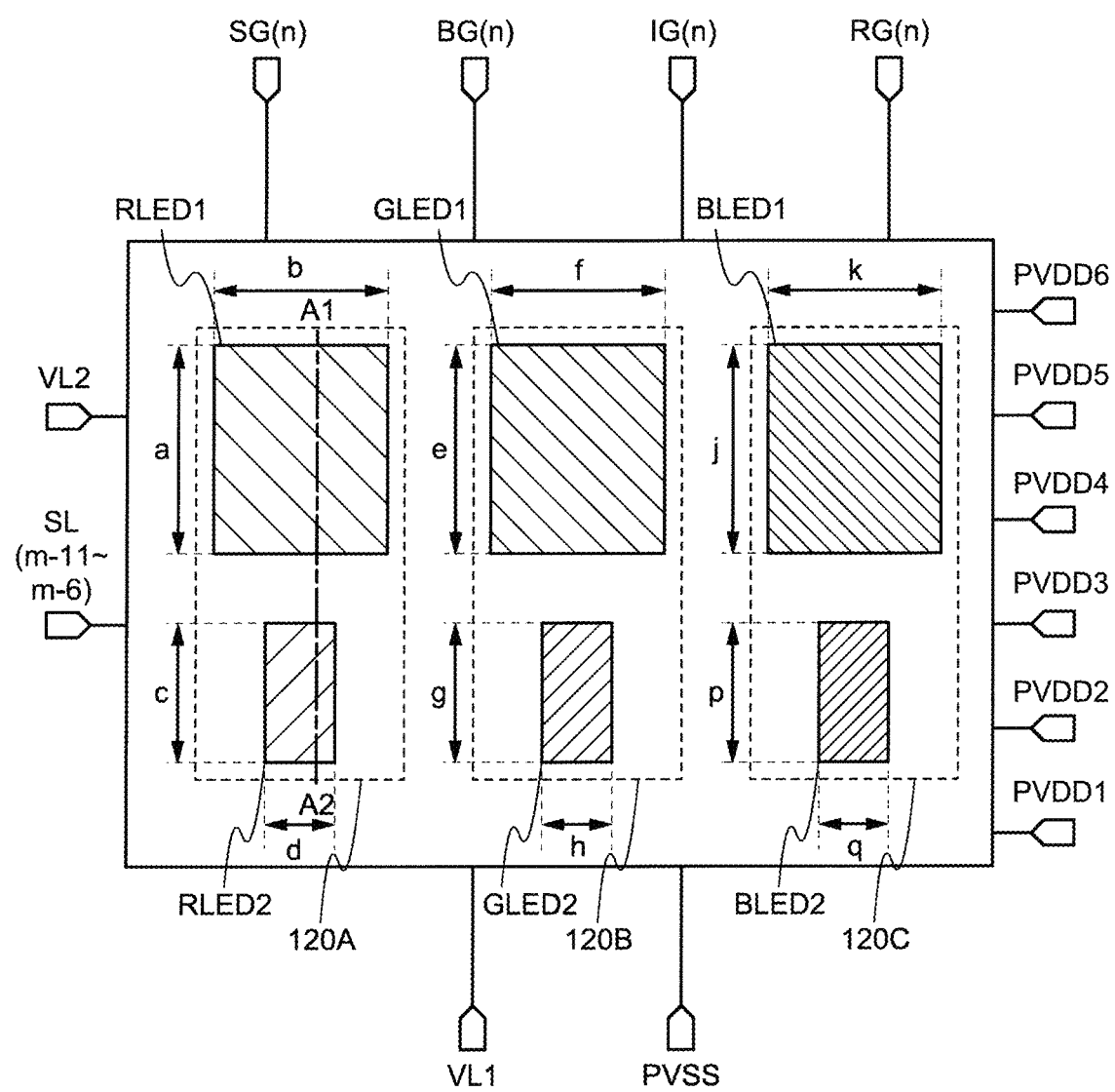
FIG. 3 is a schematic plan view showing a configuration of a pixel according to an embodiment.

FIG. 3 is a plan view showing a configuration of the pixel 120 according to an embodiment. FIG. 4 is a circuit diagram showing a circuit configuration of a sub-pixel 120A according to an embodiment. FIGS. 3 and 4 show a configuration of the pixel 120 at the n line and m column shown in FIG. 2. The configuration of the pixel 120 and the sub-pixel 120A shown in FIGS. 3 and 4 is an example. The configuration of the pixel 120 and the sub-pixel 120A is not limited to the configuration shown in FIGS. 3 and 4. The same or similar components as those in FIGS. 1 and 2 will not be described here.

As shown in FIG. 3, the pixel 120 has, for example, the sub-pixel 120A, a sub-pixel 120B, and a sub-pixel 120C.

The sub-pixel 120A has a first light-emitting element RLED1 and a second light-emitting element RLED2. The first light-emitting element RLED1 and the second light-emitting element RLED2 are red light-emitting diodes. The shapes of the first light-emitting element RLED1 and the second light-emitting element RLED2 are, for example, the shape of regular squares. The long side and short side of the first light-emitting element RLED1 are the lengths a and the short sides b, and the area of the first light-emitting element RLED1 is the area a×b. The long side and short side of the second light-emitting element RLED2 are the lengths c and the short sides d, and the area of the second light-emitting element RLED2 is the area c×d. The area c×d is smaller than the area a×b, and the area a×b is twice or approximately twice the area c×d. A chip area of the first light-emitting element RLED1 may be a factorial multiple of 2 of the chip area of the second light-emitting element RLED2. In this case, it is assumed that the first light-emitting element RLED1 and the second light-emitting element RLED2 have the same luminance, and that the luminous intensity corresponding to the ratio of the chip area is obtained.

The sub-pixel 120B has a first light-emitting element GLED1 and a second light-emitting element GLED2. The first light-emitting element GLED1 and the second light-emitting element GLED2 are green light-emitting diodes. The shapes of the first light-emitting element GLED1 and the second light-emitting element GLED2 are, for example, the shape of regular squares. The long side and short side of the first light-emitting element GLED1 are the lengths e and the short sides f, and the area of the first light-emitting element GLED1 is the area e×f. The long side and short side of the second light-emitting element GLED2 are the lengths g and the short sides h, and the area of the second light-emitting element GLED2 is the area g×h. The area g×h is smaller than the area e×f, and the area e×f is twice or approximately twice the area g×h. The chip area of the first light-emitting element GLED1 may be a factorial multiple of 2 of the chip area of the second light-emitting element GLED2. In this case, it is assumed that the first light-emitting element GLED1 and the second light-emitting element GLED2 have the same luminance, and the luminous intensity corresponding to the ratio of the chip area is obtained.

The sub-pixel 120C has a first light-emitting element BLED1 and a second light-emitting element BLED2. The first light-emitting element BLED1 and the second light-emitting element BLED2 are blue light-emitting diodes. The shapes of the first light-emitting element BLED1 and the second light-emitting element BLED2 are, for example, the shape of regular squares. The long side and short side of the first light-emitting element BLED1 are the lengths j and the short sides k, and the area of the first light-emitting element BLED1 is the area j×k. The long side and short side of the second light-emitting element BLED2 are the lengths p and the short sides q, and the area of the second light-emitting element BLED2 is the area p×q. The area p×q is smaller than the area j×k, and the area j×k is twice or approximately twice the area p×q. The chip area of the first light-emitting element BLED1 may be a factorial multiple of 2 of the chip area of the second light-emitting element BLED2. In this case, it is assumed that the first light-emitting element BLED1 and the second light-emitting element BLED2 have the same luminance, and the luminous intensity corresponding to the ratio of the chip area is obtained.

In an embodiment, an example in which one pixel 120 has three sub-pixels and each of the three sub-pixel has two light-emitting elements with different areas is shown, but the configurations of the pixel and the sub-pixel are not limited to the example shown here. For example, the pixel 120 may have equal to or more than four sub-pixels. The sub-pixel may have three or more light-emitting elements with different areas. Specifically, in addition to the three sub-pixels according to an embodiment, the sub-pixel may have a sub-pixel having two yellow light-emitting diodes with different area. Since the one pixel 120 has four sub-pixels, the display device 100 can display an image with more colors on a high-definition display unit.

As shown in FIG. 4, the sub-pixel 120A has a first light-emitting element driving unit 108A and a second light-emitting element driving unit 108B. The configuration of the second light-emitting element driving unit 108B differs from that of the configuration of the first light-emitting element driving unit 108A in that the light-emitting element is the second light-emitting element RLED2, a storage capacitor is a storage capacitor SC2, and the drive power line is the second drive power line PVDD2. In the second light-emitting element driving unit 108B, configurations other than the light-emitting element and the drive power are the same configuration as the first light-emitting element driving unit 108A. Each of configurations of the sub-pixel 120B and the sub-pixel 120C has a different light-emitting element compared to the sub-pixel 120A. In each of the sub-pixel 120B and the sub-pixel 120C, configurations other than the light-emitting element are the same as those of the sub-pixel 120A. Therefore, in the following, the configuration of the sub-pixel 120A and the configuration of the first light-emitting element driving unit 108A will be mainly described.

As shown in FIG. 4, the first light-emitting element driving unit 108A includes a drive transistor DRT, a select transistor SST (a first switch), an initialization transistor IST (a second switch), a reset transistor RST (a third switch), a light emission control transistor BCT (a fourth switch), a storage capacitor (capacitor) SC1, the first light-emitting element RLED1, a cathode capacitance Ccd and an additional capacitance Cel. Each of these transistors has a first electrode (a gate electrode), a pair of electrodes consisting of a second electrode and a third electrode (a source electrode, a drain electrode). Each of the storage capacitor SC1, the cathode capacitance Ccd and the additional capacitance Cel has a pair of electrodes. The additional capacitance Cel may be a parasitic capacitance of the first light-emitting element RLED1 and may include the capacitor provided in parallel with the first light-emitting element RLED1 and the parasitic capacitance of the first light-emitting element RLED1.

The first drive voltage VDDH1, a reference voltage VSS, and the voltage Vrst are power supply voltages for driving the first light-emitting element RLED1 of the first light-emitting element driving unit 108A. The first drive voltage VDDH1 is supplied from the first drive power line PVDD1. The reference voltage VSS is supplied from the reference potential line PVSS. The voltage Vrst is supplied from the reset signal VL1. The second drive voltage VDDH2 is a power supply voltage that drives the second light-emitting element RLED2 of the second light-emitting element driving unit 108B. The second drive voltage VDDH2 is supplied from the second drive power line PVDD2. The voltage Vrst is smaller than the first drive voltage VDDH1 and the second drive voltage VDDH2, can be substantially the same as the reference potential VSS. The first drive voltage VDDH1 may be larger than the second drive voltage VDDH2, the third drive voltage VDDH3 may be larger than the fourth drive voltage VDDH4, the fifth drive power line PVDD5 may be larger than the sixth drive voltage VDDH6.

The drive transistor DRT has a function of using the input video signal to pass a current through the first light-emitting element RLED1 to cause the first light-emitting element RLED1 to emit light. The select transistor SST has a function of supplying the video signal to the drive transistor DRT. The initialization transistor IST has a function of supplying the voltage Vini to a first electrode (a gate electrode) 620 or the like of the drive transistor DRT and resets the drive transistor DRT. The light emission control transistor BCT has a function of controlling the connection and disconnection between the first drive power line PVDD1 or the second drive power line PVD2 and the drive transistor DRT. In other words, the light emission control transistor BCT controls the electrical connection and disconnection between the drive transistor DRT and the first light-emitting element RLED1, and the electrical connection and disconnection between the drive transistor DRT and the additional capacitance Cel. That is, the light emission control transistor BCT has a function of controlling the light emission and the non-light emission of the first light-emitting element RLED1. As a power supply voltage driving the second light-emitting element RLED2 of the second light-emitting element driving unit 108B, the second drive voltage VDDH2 is supplied from the second drive power line PVDD2. That is, the light emission control transistor BCT has a function of controlling the light emission and the non-light emission of the first light-emitting element RLED1.

The reset transistor RST has a function of supplying the voltage Vrst to a third electrode 630 (a drain electrode 630) of the drive transistor DRT, supplying the voltage Vrst to a first electrode 660 of the first light-emitting element RLED1, and resetting a second electrode 610 (a source electrode 610) of the drive transistor DRT and the first light-emitting element RLED1. The first electrode 660 of the first light-emitting element RLED1 is, for example, an anode electrode. The reset transistor RST of the second light-emitting element driving unit 108B supplies the voltage Vrst to the first electrode 660 of the second light-emitting element RLED2 and has a similar function to the reset transistor RST of the first light-emitting element driving unit 108A.

The storage capacitor SC1 has a function of holding a voltage corresponding to a threshold of the drive transistor DRT. The storage capacitor SC1 has a function of holding a voltage that is input to the first electrode 620 (the gate electrode 620) of the drive transistor DRT for the pixel 120 to emit light. That is, the storage capacitor SC1 has a function for holding the input video signal. The storage capacitor SC2 has a similar configuration and function as the storage capacitor device SC1.

The display device 100 according to an embodiment has the storage capacitor such as the storage capacitor SC2 and the storage capacitor SC1 as to hold the input video signal, but an element holding the input video signal may not be the storage capacitor. For example, the element capable of holding signals or voltages may be an element capable of holding binary data, such as a SRAM.

The first light-emitting element RLED1 has diode characteristics. The additional capacitance Cel is the capacitance included in the first light-emitting element RLED1. The cathode capacitance Ccd is the capacitance formed between the first electrode 660 of the first light-emitting element RLED1 and the reference potential line PVSS. The second light-emitting element RLED2, like the first light-emitting element RLED1, has diode characteristics. The additional capacitance Cel is also the capacitance included in the second light-emitting element RLED2. The cathode capacitance Ccd is also the capacitance formed between the first electrode 660 of the second light-emitting element RLED2 and the reference potential line PVSS. In an embodiment, the input video signal may be held by the additional capacitance Cel and the storage capacitor SC1 or SC2.

The gate electrode of the initialization transistor IST is electrically connected to an initialization control line 416. The initialization control signal IG (n) is supplied to the initialization control line 416. The initialization transistor IST is controlled in a conductive state and a non-conductive state by the signal supplied to the initialization control signal IG (n). When the signal supplied to the initialization control signal IG (n) is at a low level (Low Level, L level), the initialization transistor IST is in a non-conductive state. When the signal supplied to the initialization control signal IG (n) is at a high level (High Level, H level), the initialization transistor IST is in a conductive state. The source electrode of the initialization transistor IST is electrically connected to a second reset voltage line 414. The second reset signal VL2 is supplied to the second reset voltage line 414. The drain electrode of the initialization transistor IST is electrically connected to the gate electrode 620 of the drive transistor DRT, the drain electrode of the select transistor SST, and a first electrode 640 of the storage capacitor SC1. The second electrode of the storage capacitor SC1 is electrically connected to the source electrode 610 of the drive transistor DRT, the drain electrode of the reset transistor RST, the first electrode 660 of the first light-emitting element RLED1, and the first electrode of the additional capacitance Cel. The second electrode of the storage capacitor SC2 is electrically connected to the source electrode 610 of the drive transistor DRT of the second light-emitting element driving unit 108B, the drain electrode of the reset transistor RST of the second light-emitting element driving unit 108B, the first electrode 660 of the second light-emitting element RLED2, and the first electrode of the additional capacitance Cel.

The gate electrode of the select transistor SST is electrically connected to a scanning signal line 408. The scanning signal SG (n) is supplied to the scanning signal line 408. The select transistor SST is controlled in a conductive state and a non-conductive state by the signal supplied to the scanning signal SG (n). When the signal supplied to the scanning signal SG (n) is at the L level, the select transistor SST is in the non-conductive state. When the signal supplied to the scanning signal SG (n) is at the H level, the select transistor SST is in the conductive state. The source electrode of the select transistor SST is electrically connected to a video signal line 409. The video signal SL (m) is supplied to the video signal line 409.

The gate electrode of the light emission control transistor BCT is electrically connected to a light emission control line 418. The light emission control signal BG (n) is supplied to the light emission control line 418. The light emission control transistor BCT is controlled in the conductive state, the non-conductive state by the signal supplied to the light emission control signal BG (n). When the signal supplied to the light emission control signal BG (n) is at the L level, the light emission control transistor BCT is in the non-conductive state. When the signal supplied to the light emission control signal BG (n) is at the H level, the light emission control transistor BCT is in the conductive state. The drain electrode of the light emission control transistor BCT is electrically connected to the first drive power line PVDD1 or the second drive power line PVDD2. The first drive power line PVDD1 is a first drive power line 428. The second drive power line PVDD2 is a second drive power line 429. The source electrode of the light emission control transistor BCT is electrically connected to the drain electrode 630 of the drive transistor DRT.

The gate electrode of the reset transistor RST is electrically connected to a first reset signal line 412. The first reset signal line 412, the first reset signal RG is supplied to the first reset signal line 412. The reset transistor RST is controlled in the conductive state, the non-conduction state by the signal supplied to the first reset signal line 412. When the signal supplied to the first reset signal line 412 is at the L level, the reset transistor RST is in the non-conductive state. When the signal supplied to the first reset signal line 412 is the H level, the reset transistor RST is in the conductive state. The source electrode of the reset transistor RST is supplied with the first reset signal VL1.

A second electrode 670 of the first light-emitting element RLED1, the cathode capacitance Ccd and the second electrode of the additional capacitance Cel are electrically connected to a reference potential line PVSS. The reference potential line PVSS is electrically connected to, for example, the cathode electrode. The second electrode 670 of the second light-emitting element RLED2 is electrically connected to the reference potential line PVSS similar to the second electrode 670 of the first light-emitting element RLED1, the second electrode of the cathode capacitance Ccd and the additional capacitance Cel are electrically connected to the reference potential line PVSS.

The drain electrode of the initialization transistor IST, the drain electrode of the select transistor SST, the gate electrode 620 of the drive transistor DRT, and the first electrode of the storage capacitor SC1 are electrically connected to a first node A. The drain electrode of the reset transistor RST, the source electrode 610 of the drive transistor DRT, the second electrode of the storage capacitor Cs, the first electrode 660 of the first light-emitting element RLED1, and the first electrode of the additional capacitance Cel are electrically connected to a second node B. The drain electrode 630 of the drive transistor DRT and the source electrode of the light emission control transistor BCT are electrically connected to a third node C.

Since the first reset signal line 412 supplies the common voltage Vrst to each pixel, the first reset signal line 412 may be referred to as a second common electrode in an embodiment. Since the second reset voltage line 414 supplies the common voltage Vini to each pixel, the second reset voltage line 414 may be referred to as a third common electrode in an embodiment. The voltage Vrst and the voltage Vini are substantially the same voltage. Since the voltage Vrst and the voltage Vini are substantially the same, the voltage of the gate electrode 620 of the drive transistor DRT and the voltage of the source electrode 610 of the drive transistor DRT can be substantially the same at the time of resetting the drive transistor DRT. Therefore, both the resetting of the drive transistor DRT and the correcting of the threshold of the drive transistor DRT can be performed with high accuracy.

In an embodiment, the conductive state means a state in which the source electrode and the drain electrode of the transistor are conductive and the transistor is turned on (ON). In an embodiment, the non-conductive state means a state in which the source electrode and the drain electrode of the transistor are non-conductive and the transistor is turned off (OFF). In each of transistors, the source electrode and the drain electrode may be replaced depending on the voltage of each electrode. It will be readily understood by those skilled in the art that a slight current, such as a leakage current, flows even when the transistor is in the off state.

Each of transistors shown in FIG. 4 can include a group 14 element such as silicon or germanium, or an oxide exhibiting semiconductor characteristics in a channel region. For example, the channel region of each of transistors includes low temperature polysilicon (LTPS). In the display device 100 according to an embodiment, each transistor is formed using a thin film transistor (TFT) and has an n-channel field-effect transistor (FET). Each of transistors may have the n-channel field-effect transistor and a p-channel field-effect transistor or may have only the p-channel field-effect transistor. Depending on the applications and specifications, the display device 100 may suit the configuration of the transistor, connection of the storage capacitor, and power supply voltages as appropriate.

Some transistors may be shared between the adjacent plurality of pixels. For example, the reset transistor RST may be provided in the scanning signal line drive circuit 510, one in each line. The reset transistor RST may be provided in the scanning signal line drive circuit 510, one in a plurality of lines. The reset transistor RST may be provided in the peripheral area 516, one in each line. The reset transistors RST may be provided in the peripheral area 516, one in a plurality of lines.

The configuration of the sub-pixel 120B is the configuration where each of the first light-emitting element RLED1 of the sub-pixel 120A, the second light-emitting element RLED2, the first drive power line PVDD1, the second drive power line PVDD2, the first drive voltage VDDH1, and the second drive voltage VDDH2 described above are replaced to the first light-emitting element GLED1, the second light-emitting element GLED2, the third drive power line PVDD3, the fourth drive power line PVDD4, the third drive voltage VDDH3 and the fourth drive voltage VDDH4. The rest of the configuration is the same as the configuration of the sub-pixel 120A, and therefore descriptions thereof are omitted here.

Similar to the configuration of the sub-pixel 120B, the configuration of the sub-pixel 120C is the configuration where each of the first light-emitting element RLED1 of the sub-pixel 120A, the second light-emitting element RLED2, the first drive power line PVDD1, the second drive power line PVDD2, the first drive voltage VDDH1, and the second drive voltage VDDH2 described above are replaced to a first light-emitting element BLD1, a second light-emitting element BLD2, the fifth drive power line PVDD5, the sixth drive power line PVDD6, the fifth drive voltage VDDH5 and the sixth drive voltage VDDH6. The rest of the configuration is the same as the configuration of the sub-pixel 120A, and therefore descriptions thereof are omitted here.

An example is shown in which the array of the pixel 120 is a striped array. An example is shown in which the sub-pixel 120A, the sub-pixel 120B, and the sub-pixel 120C are also arranged in a stripe shape. The pixel 120 is the smallest unit constituting a part of the image reproduced by the display 504. The arrangement of the pixel 120 is not limited, and may be appropriately determined based on, for example, the applications or specifications of the display device 100. For example, the arrangement of the pixel 120 may be a delta array or a pen tile array.

<3. An Example of Relationship Between Quantum-Efficiency and Current-Density with Respect to Area of Light-Emitting Element>

Figure 5:
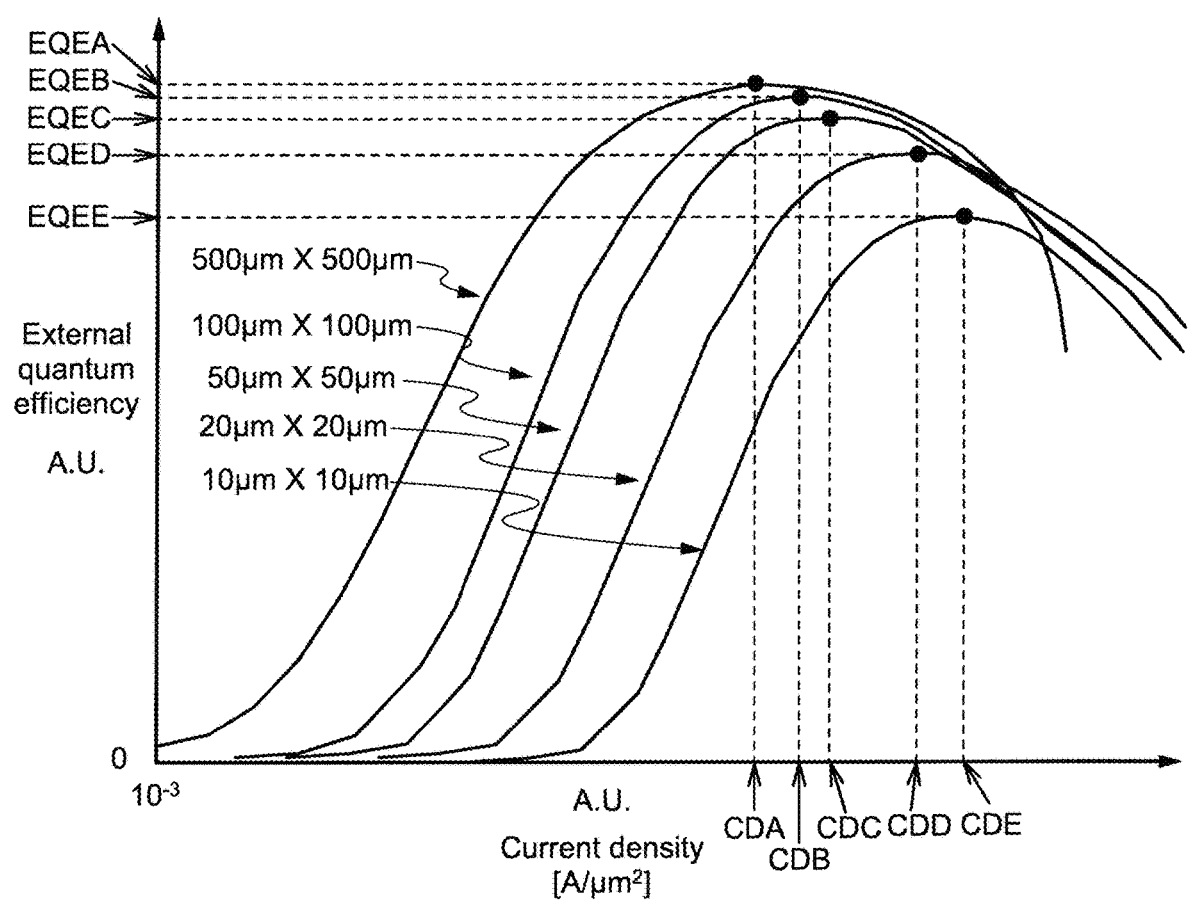
FIG. 5 is a schematic diagram showing a relationship between quantum-efficiency and current-density with respect to an area of a light-emitting element according to an embodiment.
Figure 6:
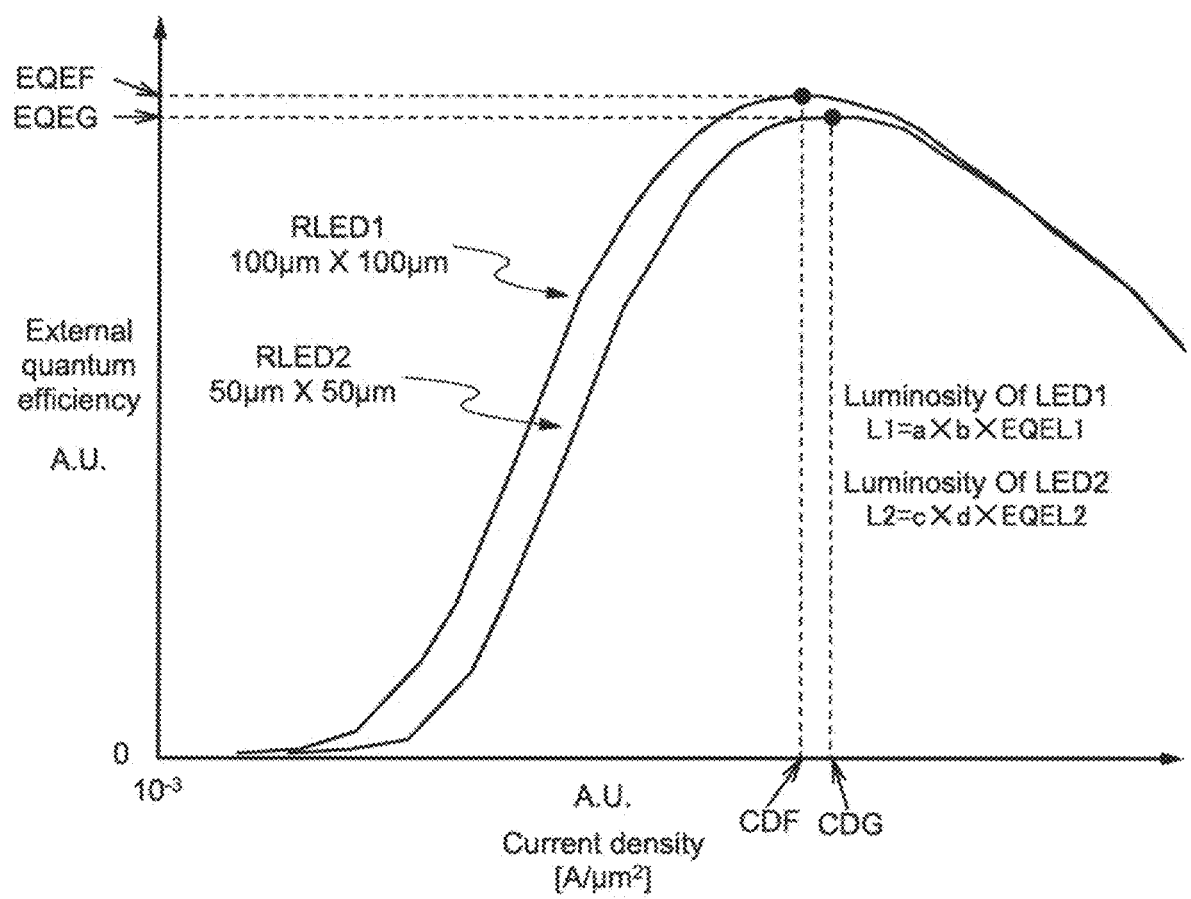
FIG. 6 is a schematic diagram showing a relationship between quantum-efficiency and current-density with respect to an area of a light-emitting element according to an embodiment.

FIG. 5 is a schematic diagram showing a relationship between quantum-efficiency and current-density with respect to an area of the light-emitting element according to an embodiment. FIG. 6 is a schematic diagram showing a relationship between quantum-efficiency and current-density with respect to an area of the light-emitting element according to an embodiment. FIGS. 5 and 6 are examples and are not limited to the graphs shown in FIGS. 3 and 4. The same or similar components as those of FIGS. 1 to 4 will not be described here.

As shown in FIG. 5, the light-emitting element has an optimal quantum-efficiency (%) with respect to a current-density (mA/µm²). A quantum-efficiency is sometimes called an external quantum-efficiency. The optimal quantum-efficiency depends on the area of the light-emitting element. For example, when the chip area of the light-emitting element is 500 µm×500 µm, the optimal quantum-efficiency is a quantum-efficiency EQEA for a current-density CDA. When the chip area of the light-emitting element is 100 µm×100 µm, the optimal quantum-efficiency is a quantum-efficiency EQEB for a current-density CDB. When the chip area of the light-emitting element is 50 µm×50 µm, the optimal quantum-efficiency is a quantum-efficiency EQEC for a current-density CDC. When the chip area of the light-emitting element is 20 µm×20 µm, the optimal quantum-efficiency is a quantum-efficiency EQED for a current-density CDD. When the chip area of the light-emitting element is 10 µm×10 µm, the optimal quantum-efficiency is a quantum-efficiency EQEE for a current-density CDE.

For example, FIG. 6 shows a relationship between the quantum-efficiency (%) and the current-density (mA/µm²) with respect to the first light-emitting element RLED1 and the second light-emitting element RLED2. For example, the chip area of the first light-emitting element RLED1 is 100 µm×100 µm, and the chip area of the second light-emitting element RLED2 is 50 µm×50 µm. The chip area of the second light-emitting element RLED2 is smaller than the chip area of the first light-emitting element RLED1, and the chip area of the first light-emitting element RLED1 is twice or approximately twice the chip area of the second light-emitting element RLED2. The chip area of the first light-emitting element RLED1 may be a factorial multiple of 2 the chip area of the second light-emitting element RLED2.

As shown in FIG. 6, the optimal quantum-efficiency of the first light-emitting element RLED1 is a quantum-efficiency EQEF for a current-density CDF. The optimal quantum-efficiency of the second light-emitting element RLED2 is a quantum-efficiency EQEG for a current-density CDG. As shown in FIG. 6, the optimal quantum-efficiency of the first light-emitting element RLED1 is the highest value of the quantum-efficiency.

A luminous intensity L1 (the first luminous intensity (cd)) of the first light-emitting element RLED1 is calculated using a chip area S1 and a luminance EQEL1 of the first light-emitting element RLED1 based on an Equation (1). The chip area S1 of the first light-emitting element RLED1 is the chip area a×b. The luminous intensity L1 of the first light-emitting element RLED1 is L1=a×b×EQEL1. A luminous intensity L2 (a second luminous intensity (cd)) of the second light-emitting element RLED2 is calculated using a chip area S2 and a luminance EQEL2 of the second light-emitting element RLED2 based on an Equation (2). The chip area S2 of the second light-emitting element RLED2 is the chip area c×d. The luminous intensity L2 of the second light-emitting element RLED2 is L2=c×d×EQEL2. The luminance EQEL1 is the luminance (cd/m²) when the first light-emitting element RLED1 is made to emit light at the current-density CDF of the optimum quantum-efficiency EQEF. The luminance EQEL2 is the luminance (cd/m²) when the second light-emitting element RLED2 is made to emit light at the current-density CDG of the optimum quantum-efficiency EQEG. That is, this value is correlated with the current-density of the current flowing through the respective light-emitting element.

$$L1 = S1 \times EQEL1 \qquad (1)$$

$$L2 = S2 \times EQEL2 \qquad (2)$$

The area of each light-emitting element is determined based on an Equation (3). According to the Equation (3), an area ratio when each light-emitting element is equal is a factorial multiple of 2. Here, as described above, the numerical value n is an arbitrary integer of 1 or more. For example, if the sub-pixel has three light-emitting elements, the ratio of the chip area of each light-emitting element is composed of $2^0 : 2^1 : 2^2 = 1:2:4$.

$$Xn : Xn{-}1 : Xn{-}2 : \ldots : X3 : X2 : X1 = 1:2:4: \ldots : 2^{(n-3)} : 2^{(n-2)} : 2^{(n-1)} \qquad (3)$$

In the light-emitting element, the luminance emitted by the light-emitting element increases monotonically, for example, with respect to the voltage applied to the light-emitting element. In this case, the voltage to be applied to the light-emitting element is uniquely determined with respect to the luminance emitted by the light-emitting element. In the display device 100 according to an embodiment, the first drive voltage VDDH1 is determined based on the luminous intensity L1 of the first light-emitting element RLED1 and the second drive voltage VDDH2 is determined based on the luminous intensity L2 of the second light-emitting element RLED2.

Similar to the first light-emitting element RLED1 and the second light-emitting element RLED2, in each of the first light-emitting element GLED1 and the second light-emitting element GLED2, based on a relationship between the quantum-efficiency and the current-density with respect to the area of the first light-emitting element GLED1 and the second light-emitting element GLED2, and the Equations (1) and (2), the first luminous intensity L1 of the first light-emitting element GLED1 and the second luminous intensity L2 of the second light-emitting element GLED2 are calculated. Furthermore, the third drive voltage VDDH3 is determined based on the luminous intensity L1 of the first light-emitting element GLED1, and the fourth drive voltage VDDH4 is determined based on the luminous intensity L2 of the second light-emitting element GLED2.

Similar to the first light-emitting element RLED1 and the second light-emitting element RLED2, in each of the first light-emitting element BLED1 and the second light-emitting element BLED2, based on a relationship between the quantum-efficiency and the current-density with respect to the area of the first light-emitting element BLED1 and the second light-emitting element BLED2, and the Equations (1) and (2), the first luminous intensity L1 of the first light-emitting element BLED1 and the second luminous intensity L2 of the second light-emitting element BLED2 are calculated. Furthermore, the fifth drive voltage VDDH5 is determined based on the luminous intensity L1 of the first light-emitting element BLED1, and the sixth drive voltage VDDH6 is determined based on the luminous intensity L2 of the second light-emitting element BLED2.

As described above, when the light-emitting element is a micro-LED, the optimum current-density depends on the chip area of the micro-LED. When the light-emitting element is a micro-LED, the luminance depends on the chip area of the micro-LED but is not necessarily proportional to the chip area. Consequently, the chip area of the micro-LED can be optimized according to the luminance. The luminance here is related to the quantum-efficiency. In FIGS. 5 and 6, the external quantum-efficiency may be replaced with luminance. The optimal value (maximum value) of the quantum-efficiency depends on the chip area of the micro-LED. The smaller the chip area of the micro-LED, the larger the optimum current and the smaller the optimum quantum-efficiency. The larger the chip area of the micro-LED, the smaller the optimum current and the greater the optimum quantum-efficiency. As a result, the chip area of the micro-LED can be optimized according to the quantum-efficiency and the current-density.

The display device 100 can optimize each of the chip area of the micro-LED emitting different colors for each of the emitting colors, depending on the luminance. For example, the reset transistor RST can optimize the chip area of the micro-LED emitting different colors for each of the emitting colors, depending on the quantum-efficiency and the current-density.

The display device 100 according to an embodiment can cause the micro-LED of each chip area to emit light by applying a voltage corresponding to the luminance inherent to each light-emitting element calculated based on the maximum value of the quantum-efficiency with respect to the current-density. For example, even if the display device 100 is a plurality of micro-LEDs with different areas, the micro-LEDs with the same area can be driven at voltages inherent to each micro-LED based on the maximum quantum-efficiency with respect to the same current-density. In other words, the display device 100 according to an embodiment can determine the chip area of the micro-LED to have an optimal luminance for the voltages to be supplied. Consequently, the display device 100 can mitigate differences in chromaticity and minimize differences in the lifetime of the plurality of LEDs. Therefore, by using the display device 100, it is possible to suppress a decrease in the long-term reliability of the display device.

The display device 100 according to an embodiment has a configuration in which different drive voltages are supplied to each micro-LED in response to the chip area of the micro-LED emitting different colors. Specifically, the first drive voltage VDDH1 to the sixth drive voltage VDDH6 corresponding to each of the six micro-LED chips are supplied to the six micro-LED chips. The configuration for supplying the drive voltage is not limited to the configuration shown here. For example, the drive voltage is the first drive voltage VDDH1 and the second drive voltage VDDH2, the first drive voltage VDDH1 may be supplied to the first light-emitting element RLED1, the first light-emitting element GLED1, and the first light-emitting element BLD1, and the second drive voltage VDDH2 may be supplied to the second light-emitting element RLED2, the second light-emitting element GLED2, and the second light-emitting element BLD2. In this case, the chip area of each of the light-emitting elements is configured to be a luminance that emits light at the maximum value of the quantum-efficiency with respect to the first drive voltage VDDH1 or the second drive voltage VDDH2.

The display device 100 can cause the micro-LED of each chip area to emit light by applying a voltage corresponding to the luminance inherent to each light-emitting element calculated based on the maximum value of the quantum-efficiency with respect to the current-density. Even if the display device 100 has a plurality of micro-LEDs with different areas, the micro-LEDs with the same area among a plurality of micro-LEDs can be driven at voltages inherent to each micro-LED based on the maximum quantum-efficiency with respect to the same current-density. In other words, the display device 100 can determine the chip area of the micro-LED to have an optimal luminance for the voltages to be supplied. Consequently, the display device 100 can mitigate differences in chromaticity and minimize differences in the lifetime of the plurality of LEDs. Therefore, by using the display device 100, it is possible to suppress a decrease in the long-term reliability of the display device.

<4. Driving Method>

Figure 7:
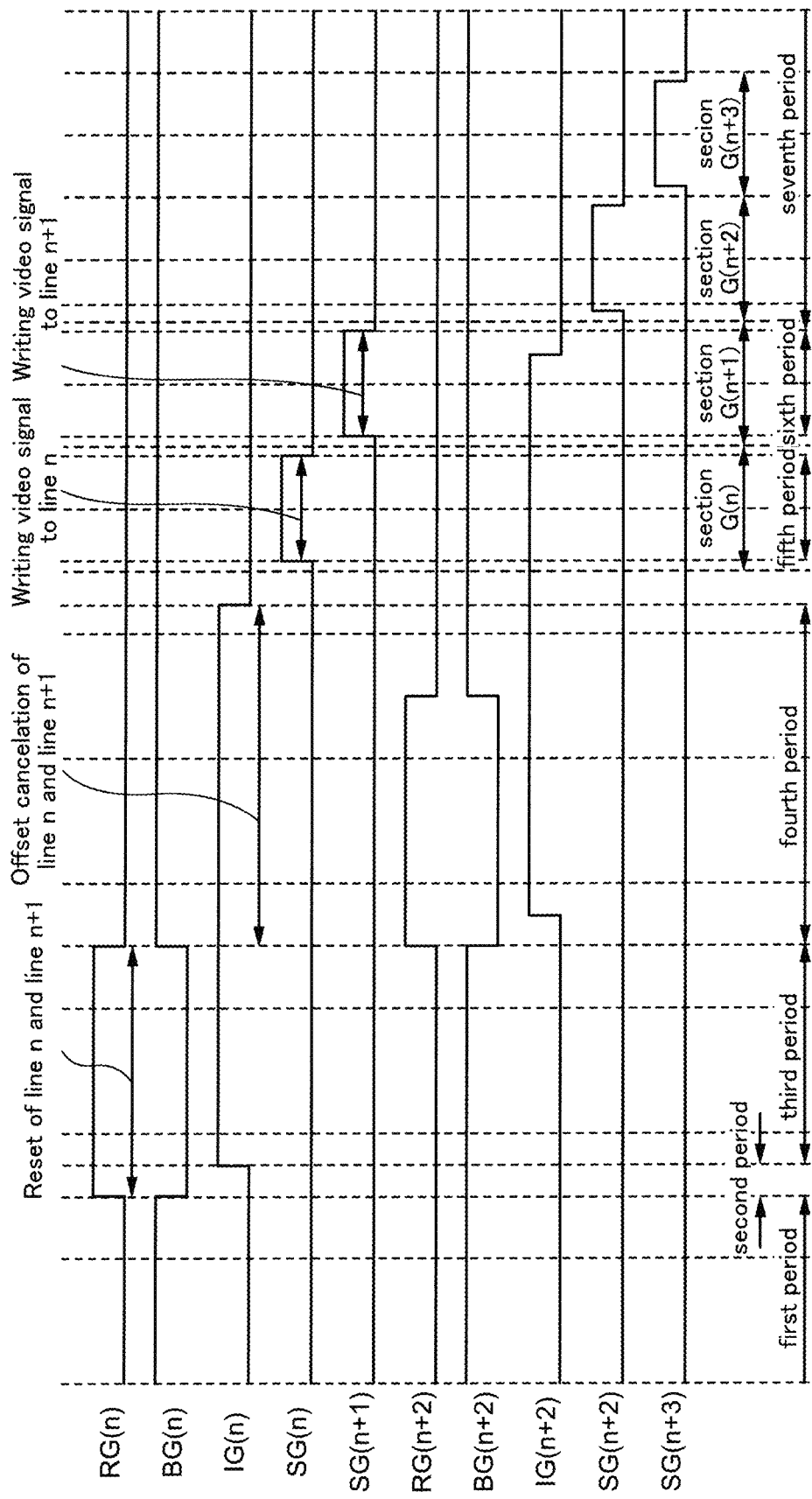
FIG. 7 is a schematic diagram showing a timing chart of a display device according to an embodiment.

FIG. 7 is a schematic diagram showing a timing chart of the display device 100 according to an embodiment. FIG. 8 to FIG. 12 are schematic diagrams showing operation status of the first light-emitting element driving unit 108A of the sub-pixel 120A at the timing shown in FIG. 7. FIG. 13A is a diagram showing an example of a first sub-frame period and a second sub-frame period of the display device 100 according to an embodiment. FIG. 13B is a diagram showing an example of one frame (1F) period of the display device 100 according to an embodiment. The driving method shown in FIGS. 7 to 13 is an example of the driving method of the display device 100 according to an embodiment, and the driving method of the display device 100 is not limited to the driving method shown in FIGS. 7 to 13. The same or similar components as those of FIGS. 1 to 6 will not be described here.

Each of signal lines, signals, and power lines are supplied from the video signal line drive circuit 506 and the scanning signal line drive circuit 510, for example, as described with reference to FIGS. 1 to 4. As shown in FIG. 7, each section shown as a section G (n), a section G (n+1), a section G (n+2) and a section G (n+3) is each first horizontal period between the scanning signal line in n-th line and the scanning signal line in n+3-th line. Before the section G (n) and after the section G (n+3) will be omitted but will continue from the scanning signal line in the first line to the scanning signal line in the last line. As shown in FIG. 7, each of the periods presented in the first, second, third, fourth, fifth, sixth, and seventh periods is described in detail below. FIG. 7 shows, as an example, a timing chart for driving each scanning signal line 408 in the first to fourth lines, but FIG. 8 to FIG. 13 show operation status of the first light-emitting element driving unit 108A of the sub-pixel 120A in the n-th line and m-th column.

In an embodiment, the light-emitting state may be referred to simply as light emission, and sometimes referred to as light emitting. The non-light-emitting state may be referred to simply as non-light emission, sometimes referred to as non-light-emitting, and sometimes referred to as a state of non-light-emitting, sometimes referred to simply as it does not emit light.

In an embodiment, the frame period includes two or more sub-frame periods. A driving method of one sub-frame period in the frame periods will be described here.

<4-1. First Period (Previous Frame Light Emission)>

In the first period shown in FIG. 7, the first light-emitting element driving unit 108A maintains operation status of the previous frame period of a certain frame until a processing of the certain frame period begins.

The light emission control signal BG (n) and a light emission control signal BG (n+2) are supplied with the H level, and the first reset signal RG (n), the initialization control signal IG (n), the scanning signal SG (n), a scanning signal SG (n+1), a first reset signal RG (n+2), an initialization control signal IG (n+2), a scanning signal SG (n+2), and a scanning signal SG (n+3) are supplied with the L level. In the following explanation, attention will be paid to the scanning signal line of the n-th line and the scanning signal line of the n+1-th line. In the scanning signal line of the n+2-th line and the scanning signal line of the n+3-th line, the processing similar to the processing executed in the scanning signal line of the n-th line and the scanning signal line of the n+1-th line is executed after the third period.

<4-2. Second Period (Source Electrode Initialization of Drive Transistor DRT)>

Figure 8:
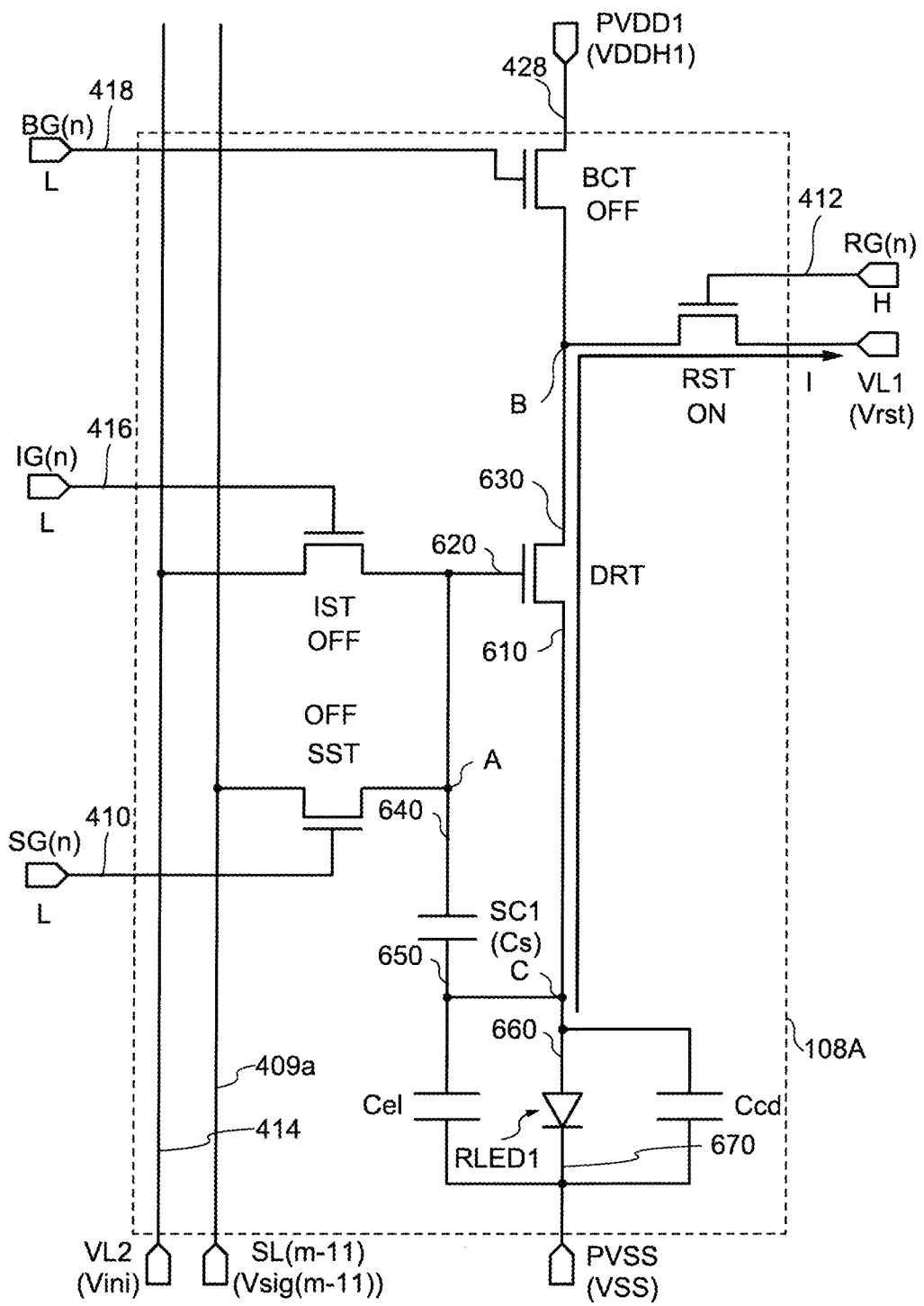
FIG. 8 is a schematic diagram showing an operation status of a pixel at a timing shown in FIG. 7.

FIG. 8 shows an operation status of the second period shown in FIG. 7 of the first light-emitting element driving unit 108A of the sub-pixel 120A in the n-th line and m-th column. The H level is supplied to the first reset signal RG (n) and the L level is supplied to the light emission control signal BG (n). Therefore, the initialization transistor IST, the select transistor SST, and the light emission control transistor BCT are in a non-conductive state. On the other hand, the reset transistor RST is in a conductive state. The drive transistor DRT is assumed to be in a non-conductive state but may be in a conductive state. In the second period, the current directed from the first drive power line PVDD1 to the first electrode 660 of the first light-emitting element RLED1 is interrupted by the light emission control transistor BCT. Consequently, the first light-emitting element RLED1 becomes non-light emission, charges remaining in the node B, the node C or the like are pulled out through the drive transistor DRT and the reset transistor RST. Consequently, the source electrode 610 of the drive transistor DRT is fixed to the voltage Vrst. The voltage of the first electrode 640 and the node A of the storage capacitor SC1 are the voltage of the video signal written in the previous frame. The voltage Vrst is a voltage lower than a light emission starting voltage of the first light-emitting element RLED1 with respect to the reference voltage VSS.

<4-3. Third Period (Gate Electrode Initialization of Drive Transistor DRT)>

Figure 9:
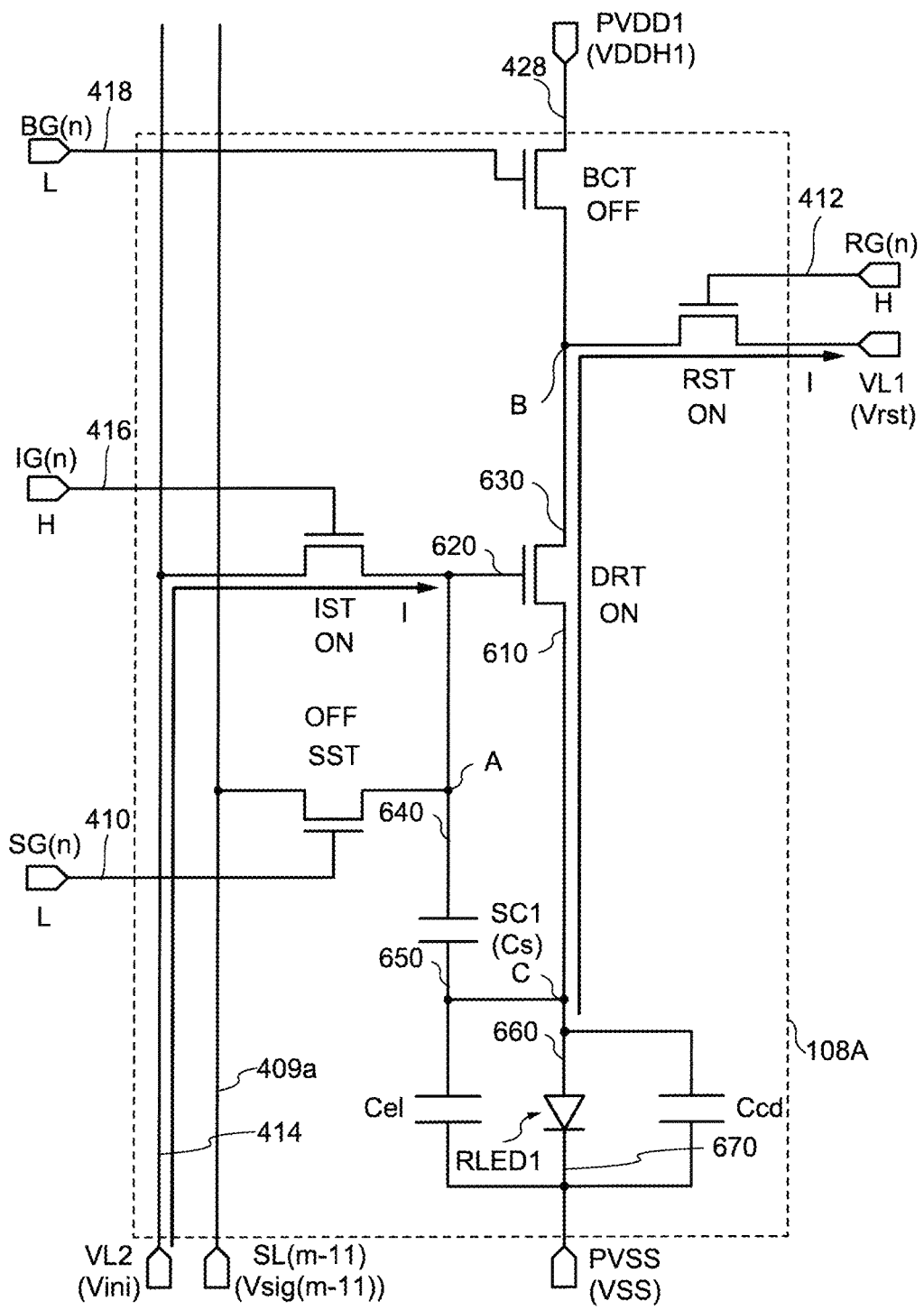
FIG. 9 is a schematic diagram showing an operation status of a pixel at a timing shown in FIG. 7.

FIG. 9 shows an operation status of the third period shown in FIG. 7 of the first light-emitting element driving unit 108A of the sub-pixel 120A in the n-th line and m-th column. With the voltage supplied to the initialization control signal IG (n) goes from the L level to the H level, the initialization transistor IST becomes conductive state. In the third period, the gate electrode 620 of the drive transistor DRT is fixed to the voltage Vini via the initialization transistor IST. That is, the gate electrode 620 of the source electrode 610 and the gate electrode 620 of the drive transistor DRT are reset (initialized). The voltage Vini is set to a voltage that is greater than the threshold voltage of the drive transistor DRT with respect to the voltage Vrst. That is, the drive transistor DRT is in a conductive state. However, since the light emission control transistor BCT is in a non-conductive state, the current from the first drive power line PVDD1 to the first electrode 660 of the first light-emitting element RLED1 does not flow to the drive transistor DRT. The voltage at the node A is the voltage Vini.

<4-4. Fourth Period (Offset Cancellation Operation)>

Figure 10:
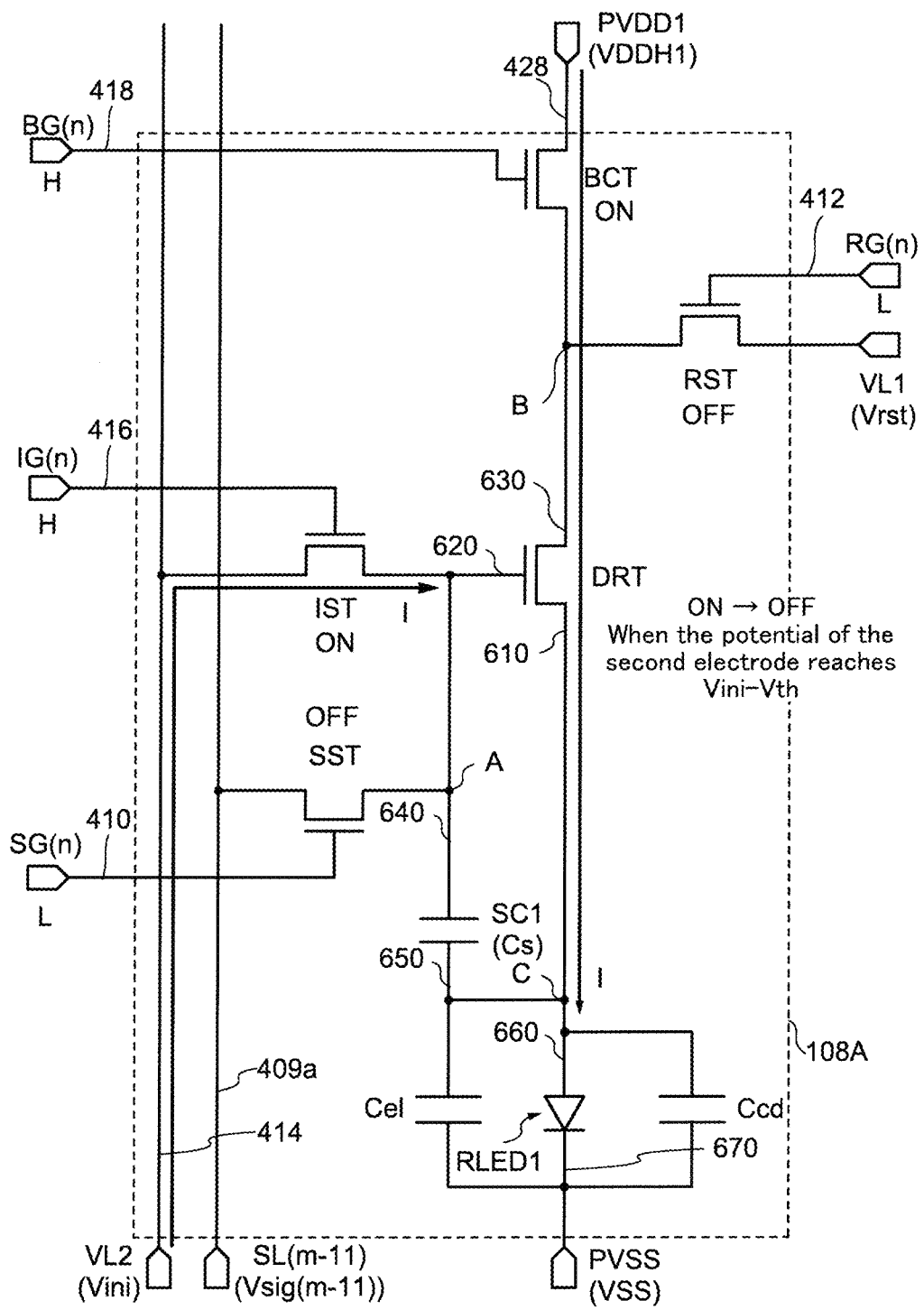
FIG. 10 is a schematic diagram showing an operation status of a pixel at a timing shown in FIG. 7.

FIG. 10 shows an operation status of the fourth period shown in FIG. 7 of the first light-emitting element driving unit 108A of the sub-pixel 120A in the n-th line and m-th column. The voltage supplied to the light emission control signal BG (n) goes from L level to H level. Therefore, the light emission control transistor BCT is in a conductive state. The reset transistor RST is in a non-conductive state. Therefore, since the light emission control transistor BCT is connected to the first drive power line PVDD1 (the first drive power line 428), the voltage of the node C is the voltage VDDH1 supplied to the first drive power line PVDD1. Consequently, a current directed from the first drive power line PVDD1 to the first electrode 660 of the first light-emitting element RLED1 flows to the drive transistor DRT (the drive transistor DRT is in a conductive state by the operation in the second period). Therefore, the source electrode 610 of the drive transistor DRT and a second electrode 650 of the storage capacitor SC1 are charged.

The voltage at the node A is fixed at the voltage Vini. When the voltage of the source electrode 610 of the drive transistor DRT and the voltage of the node B becomes Vini-Vth, since the voltage between the gate electrode 620 and the source electrode 610 of the drive transistor DRT is Vth, the drive transistor DRT becomes a non-conductive state. The display device 100, in the fourth period, can hold a charge corresponding to the threshold voltage of the drive transistor DRT between the node A and the node B (the storage capacitor SC1), it is possible to correct the threshold of the drive transistor DRT. In this case, a voltage of {(Vini-Vth)-PVSS} is supplied between the first electrode 660 and the second electrode 670 of the first light-emitting element driving unit 108A. Since this voltage is not above the light emission starting voltage of the first light-emitting element RLED1, the current does not flow to the first light-emitting element RLED1. The voltage at the node C is the first drive voltage VDDH1. The Vth is the threshold voltage of the drive transistor.

According to the timing chart of FIG. 7, in the operations from the first period to the fourth period, the operation of the scanning signal line for two lines is executed in parallel, but the driving method of the display device 100 is not limited to the timing chart of FIG. 7. The operations from the first period to the fourth period may be performed sequentially for each line of the scanning signal line, and the operation of three or more lines of the scanning signal line may be executed in parallel.

<4-5. Fifth Period and Sixth Period (Video Signal Writing Operation)>

Figure 11:
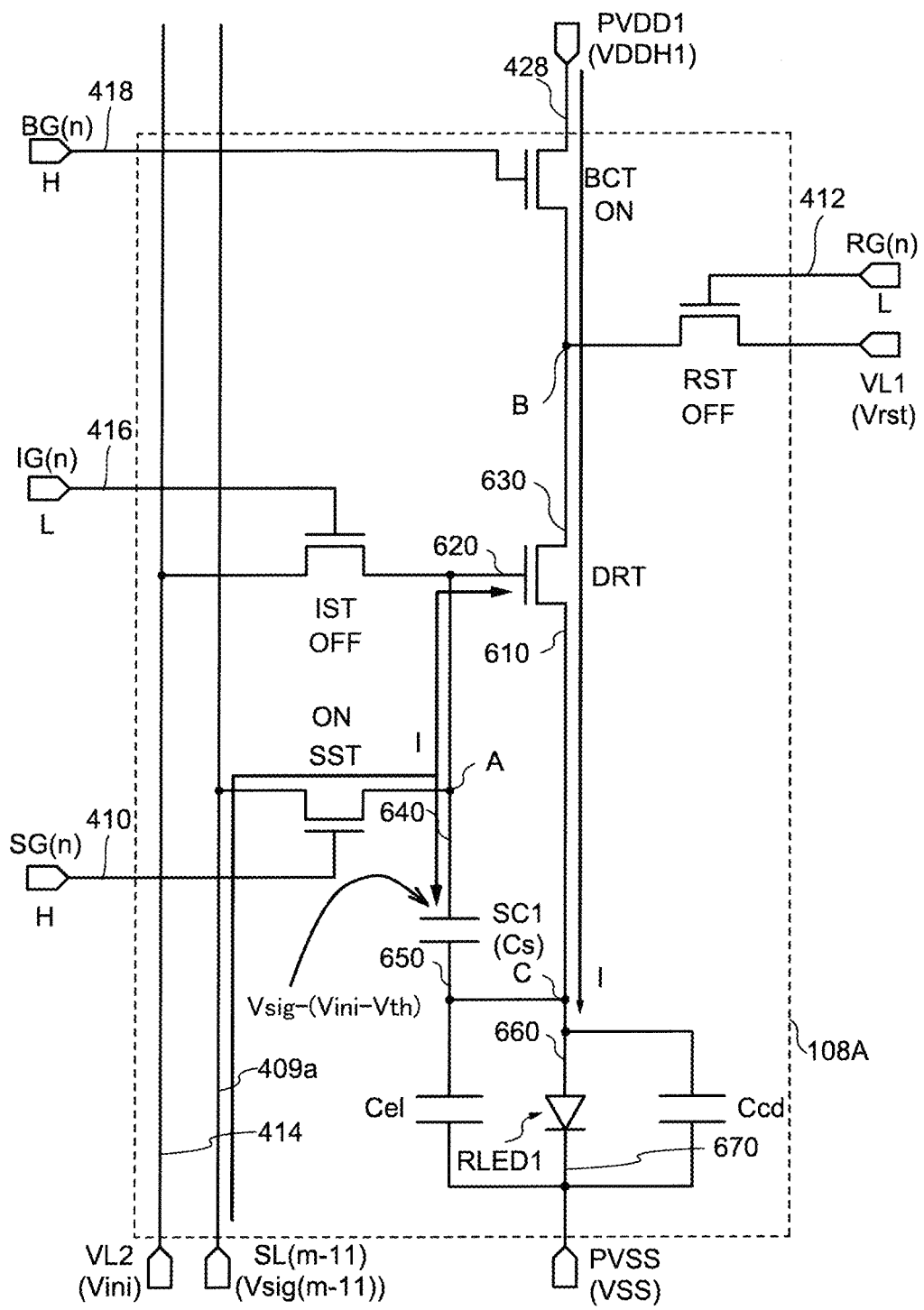
FIG. 11 is a schematic diagram showing an operation status of a pixel at a timing shown in FIG. 7.

FIG. 11 shows an operation status of the fifth period shown in FIG. 7 of the first light-emitting element driving unit 108A of the sub-pixel 120A in the n-th line and m-th column. Between the fourth period and the fifth period, the voltage supplied to the initialization control signal IG (n) goes from the H level to the L level. Therefore, the initialization transistor IST becomes a non-conductive state. Between the fourth period and the fifth period, the voltage supplied to the scanning signal SG (n) goes from the H level to the L level. Therefore, the select transistor SST becomes a conductive state. When a voltage Vsig (n) of the video signal SL (m) is supplied to a video signal line 409a, the voltage Vsig (n) is supplied to the gate electrode 620 of the drive transistor DRT, and the voltage of the gate electrode 620 of the drive transistor DRT becomes the voltage Vsig (n). On the other hand, the voltage of the source electrode 610 of the drive transistor DRT is (Vini-Vth). Consequently, the voltage between the gate electrode 620 and the source electrode 610 of the drive transistor DRT becomes {Vsig-(Vini-Vth)}, which is the variation in the threshold of the respective drive transistor DRT of the light-emitting element driving unit is reflected.

The sixth period indicates an operation status of the first light-emitting element driving unit 108A of the sub-pixel 120A in the n+1-th line and m-th column. Since the sixth period is the same as the fifth period except that the scanning signal SG (n+1) is supplied, the description thereof is omitted.

Since the video signal line 409a is shared by a plurality of lines of pixels belonging to the same column, the video signal writing operation is sequentially executed for each scanning signal line.

<4-6. Seventh Period (Light Emission or Non-Light Emission Operation)>

Figure 12:
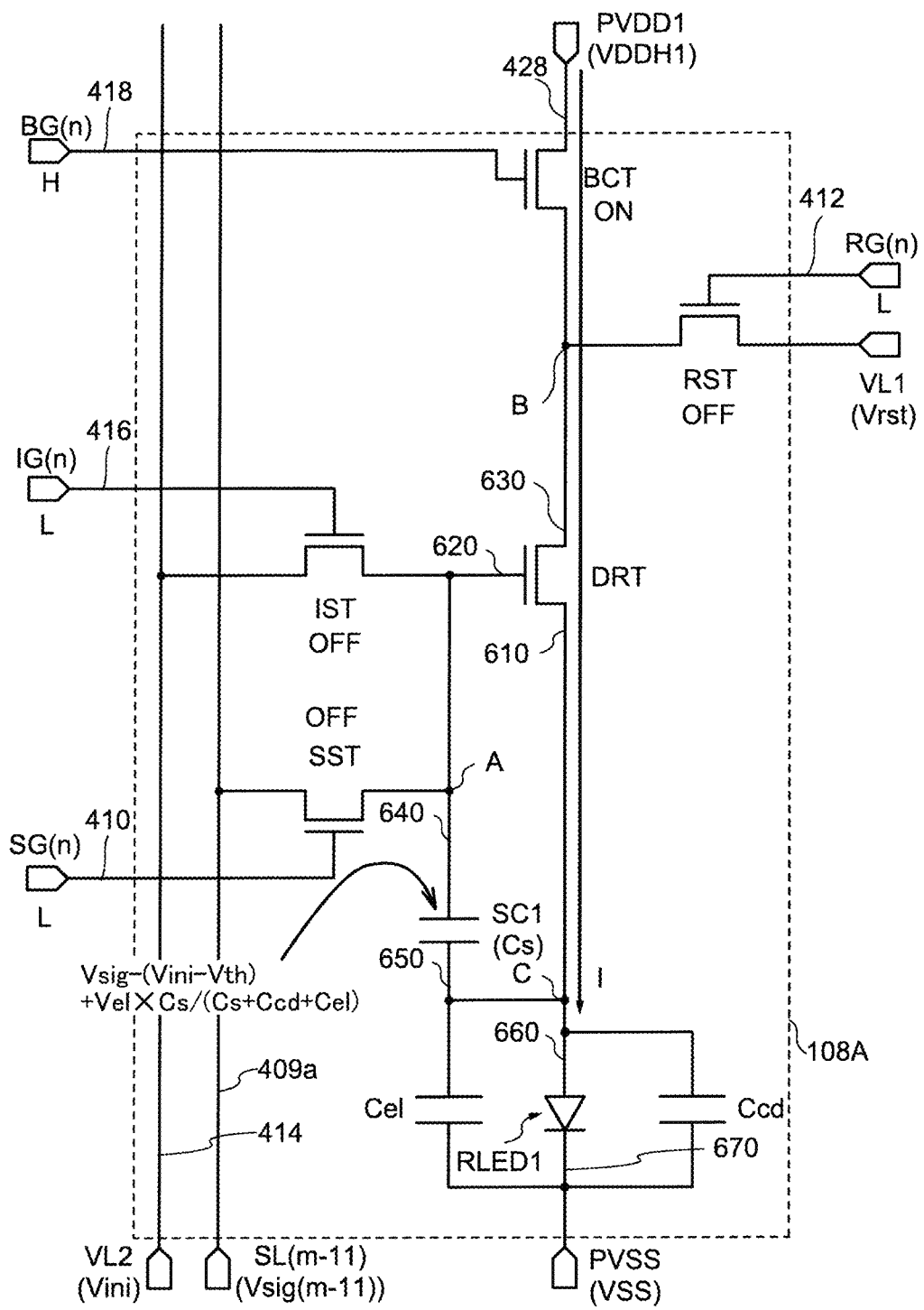
FIG. 12 is a schematic diagram showing an operation status of a pixel at a timing shown in FIG. 7.
Figure 13A:
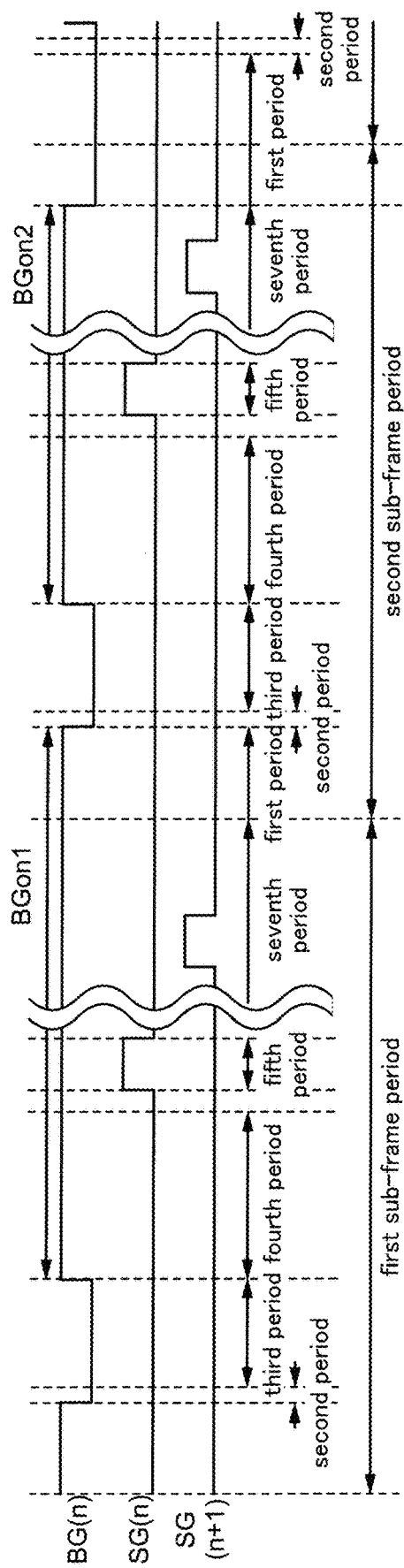
FIG. 13A is a schematic diagram showing a timing chart of a display device according to an embodiment.
Figure 13B:
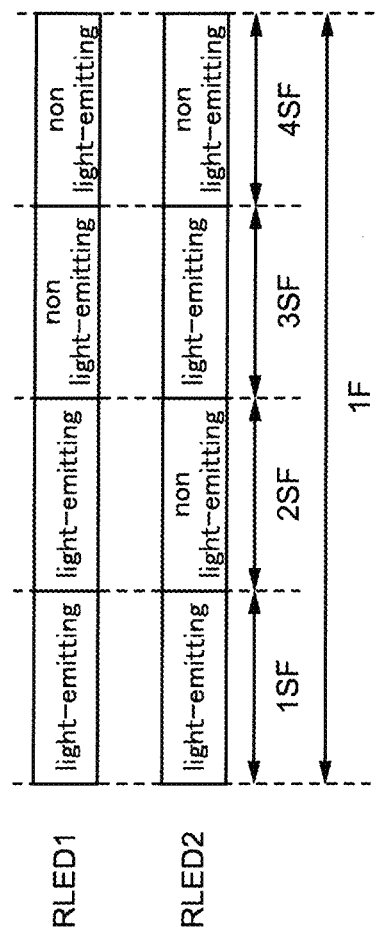
FIG. 13B is a schematic diagram showing a timing chart of a display device according to an embodiment.

FIG. 12 shows an operation status of the seventh period shown in FIG. 7 of the first light-emitting element driving unit 108A of the sub-pixel 120A in the n-th line and m-th column. Between the fifth period and the sixth period, the voltage supplied to the scanning signal SG (n) goes from the H level to the L level. Therefore, the select transistor SST becomes a non-conductive state. In accordance with the voltage between the gate electrode 620 and the source electrode 610 of the drive transistor DRT set to the fifth period (voltage of the video signal), the drive transistor DRT can flow a current in the direction from the first light-emitting element RLED1 to the first electrode 660. Therefore, the first light-emitting element RLED1 emits light at a luminance corresponding to the current flowed by the drive transistor DRT.

The voltage between the first electrode 660 and the second electrode 670 of the first light-emitting element RLED1 becomes a voltage corresponding to the current flowed by the drive transistor DRT. Since the voltage of the first electrode 660 is increased by the current flowed by the drive transistor DRT, the voltage of the gate electrode 620 of the drive transistor DRT is also increased by a coupling of the first electrode 660 and the storage capacitor SC1. Since the storage capacitor SC1, the additional capacitance Cel, the cathode capacitance Ccd, and other parasitic capacitance are added to the gate electrode of the drive transistor DRT, the increase in the voltage of the gate electrode 620 of the drive transistor DRT is slightly smaller than the increase in the voltage of the first electrode 660. Specifically, the increase in the voltage is Vel×Cs/(Cs+Ccd+Cel). A voltage Vel here is a voltage between the first electrode 660 and the second electrode 670 of the first light-emitting element RLED1, a capacitance value Cs is the capacitance value of the storage capacitor SC1, a capacitance value Cel is the capacitance value of the additional capacitance Cel, a capacitance value Ccd is the capacitance value of the cathode capacitance Ccd. Therefore, since the increase in the voltage is known, the voltage of the voltage Vsig (n) may be determined so that the current value flowing through the first light-emitting element RLED1 becomes the predetermined voltage value corresponding to the voltage between the gate electrode 620 and the source electrode 610 of the drive transistor DRT.

For example, the voltage of the gate electrode 620 of the drive transistor DRT is Vsig−(Vini−Vth)+Vel×Cs/(Cs+Ccd+Cel), the voltage of the source electrode 610 of the drive transistor DRT is the voltage Vel. The voltage between the gate electrode 620 and the source electrode 610 of the drive transistor DRT is Vsig−(Vini−Vth)−Vel×(Ccd+Cel)/(Cs+Ccd+Cel). If Vsig−(Vini−Vth)−Vel×(Ccd+Cel)/(Cs+Ccd+Cel) is greater than the Vth and the Vel is greater than the light emission starting voltage of the first light-emitting element RLED1, the drive transistor DRT flows a current to the first light-emitting element RLED1, the first light-emitting element RLED1 emits light. If Vsig−(Vini−Vth)−Vel×(Ccd+Cel)/(Cs+Ccd+Cel) is greater than the Vth and the Vel is smaller than the light emission starting voltage of the first light-emitting element RLED1, the drive transistor DRT flows a current to the first light-emitting element RLED1, but the first light-emitting element RLED1 is non-light emission. If Vsig−(Vini−Vth)−Vel×(Ccd+Cel)/(Cs+Ccd+Cel) is smaller than the Vth, the drive transistor DRT does not flow a current to the first light-emitting element RLED1, the first light-emitting element RLED1 is non-light emission.

As described above, a series of operations of the first light-emitting element driving unit 108A of the sub-pixel 120A is completed. Similar to the first light-emitting element driving unit 108A, the operations of the second light-emitting element driving unit 108B is also completed. Similar to the sub-pixel 120A, the operations of the sub-pixel 120B and the sub-pixel 120C are also completed. When the operation is completed from each sub-pixel of the first line to the sub-pixel of the last line of the scanning signal line, the operation of one sub-frame period (for example, the first sub-frame period) is completed, and the same operation is repeatedly executed in a plurality of sub-frame periods (for example, the second sub-frame period and the third sub-frame period), whereby one screen in one frame period is obtained. The operation is repeated, and an image is displayed on the display 504 of the display device 100.

The display device 100 according to an embodiment controls the light emission or non-light emission of each of the first light-emitting element RLED1 and the second light-emitting element RLED2 of the sub-pixel 120A within one sub-frame period and can change the area of the sub-pixel 120A to emit light. Similar to the sub-pixel 120A, the area where each of the sub-pixel 120B and the sub-pixel 120C emits light can also be changed.

The display device 100 according to an embodiment controls the area at which the light-emitting element emits light, and it is possible to control the gradation of each pixels. In this case, the area of the plurality of light-emitting elements included in the display device 100 according to an embodiment is predetermined. In the display device 100, controlling the area of the light-emitting element and controlling the gradation of each pixel may be referred to as a digital gradation control. The area of each of the plurality of light-emitting elements included in the display device 100 according to an embodiment is optimized according to the optimum value of quantum-efficiency or luminance. The plurality of light-emitting elements included in the display device 100 may have two light-emitting elements having at least two different areas. Even if the areas of the plurality of light-emitting elements is different from each other, the display device 100 can emit light at the voltage corresponding to luminance unique to each light-emitting element calculated based on the optimum value of quantum-efficiency. As a result, the display device 100 is less likely to cause a difference in chromaticity and can suppress a difference in the life of the plurality of light-emitting elements. Therefore, with using the display device 100, it is possible to reduces the long-term reliability degradation of the display device.

<4-7. Sub-Frame Period>

As shown in FIG. 13A, in the first sub-frame period, the time at which the voltage supplied to the light emission control signal BG (n) is H-level is a time BGon1. In the second sub-frame period, the time at which the voltage supplied to the light emission control signal BG (n) is H-level is a time BGon2. The time BGon1 is less than the time BGon2. The duration of the conductive state of the light emission control transistor BCT is controlled by using the light emission control signal BG (n). As a result, the quantity of current supplied to the first light-emitting element RLED1 and the second light-emitting element RLED2 is controlled. Therefore, the display device 100 may vary the light-emitting or non-light emitting time of the pixel (the light-emitting element) for each sub-frame period.

The light-emitting element according to an embodiment emits light at a constant luminous intensity based on the optimized quantum-efficiency, as shown in the Equations (1) and (2). The display device 100 according to an embodiment can control the gradation of each pixel by integrating the time when the light-emitting element emits light at a constant luminous intensity for each sub-frame. Integrating the time for the main light emission, controlling the gradation of each pixel, and controlling the gradation of each pixel may be referred to as an analog gradation control.

As shown in FIG. 13B, the one frame (1F) period includes, for example, a first sub-frame period 1SF, a second sub-frame period 2SF, a third sub-frame period 3SF, and a fourth sub-frame period 4SF. In the first sub-frame period 1SF, for example, both the first light-emitting element RLED1 and the second light-emitting element RLED2 emit light. In the second sub-frame period 2SF, for example, the first light-emitting element RLED1 emits light and the second light-emitting element RLED2 does not emit light. In the third sub-frame period 3SF, for example, the first light-emitting element RLED1 does not emit light and the second light-emitting element RLED2 emits light. In the fourth sub-frame period 4SF, for example, both the first light-emitting element RLED1 and the second light-emitting element RLED2 do not emit light.

The display device 100 according to an embodiment has at least two light-emitting elements having different areas and can control (the digital gradation control) the light emission or the non-light emission of each of the two light-emitting elements in every sub-frame.

The display device 100 according to an embodiment combines the analog gradation control shown in FIG. 13A with the digital gradation control shown in FIG. 13B to control the gradation of each light-emitting element and to control the gradation of each pixel. By combining the analog gradation control with digital gradation control, the display device 100 can display even higher gradation images on the display 504. The display device 100 according to an embodiment not only makes the area of each light-emitting element a factorial multiple of 2, but also sets the luminance based on the optimum value of quantum-efficiency that differ for each light-emitting element according to the area and the emission color of the light-emitting element. Consequently, the display device 100 can display an even clearer image on the display 504.

In the display device 100 according to an embodiment, the first drive voltage VDDH1, the second drive voltage VDDH2, the third drive voltage VDDH3, the fourth drive voltage VDDH4, the fifth drive voltage VDDH5 and the sixth drive voltage VDDH6 are supplied to each pixel (sub-pixel), for example, via the terminal electrode 514 from an external circuit, from the video signal line drive circuit 506, the scanning signal line drive circuit 510. The configuration for providing the drive voltage to each pixel (sub-pixel) is not limited to the configuration shown here. As described above, the drive voltage is determined by the luminance based on the Equation (1), the Equation (2), or the Equation (3), the data of the luminance based on the Equation (1), the Equation (2), or the Equation (3) and the data of the drive voltage for each luminance may be stored in a memory device such as a look-up table. The display device 100 according to an embodiment includes the memory device, reads the data of the drive voltage and the luminance from the memory device, and may generate a drive voltage using a voltage generation circuit or the like in accordance with the read drive voltage and the luminance.

<5. Example of Cross Section of Display Device 100>

Figure 14:
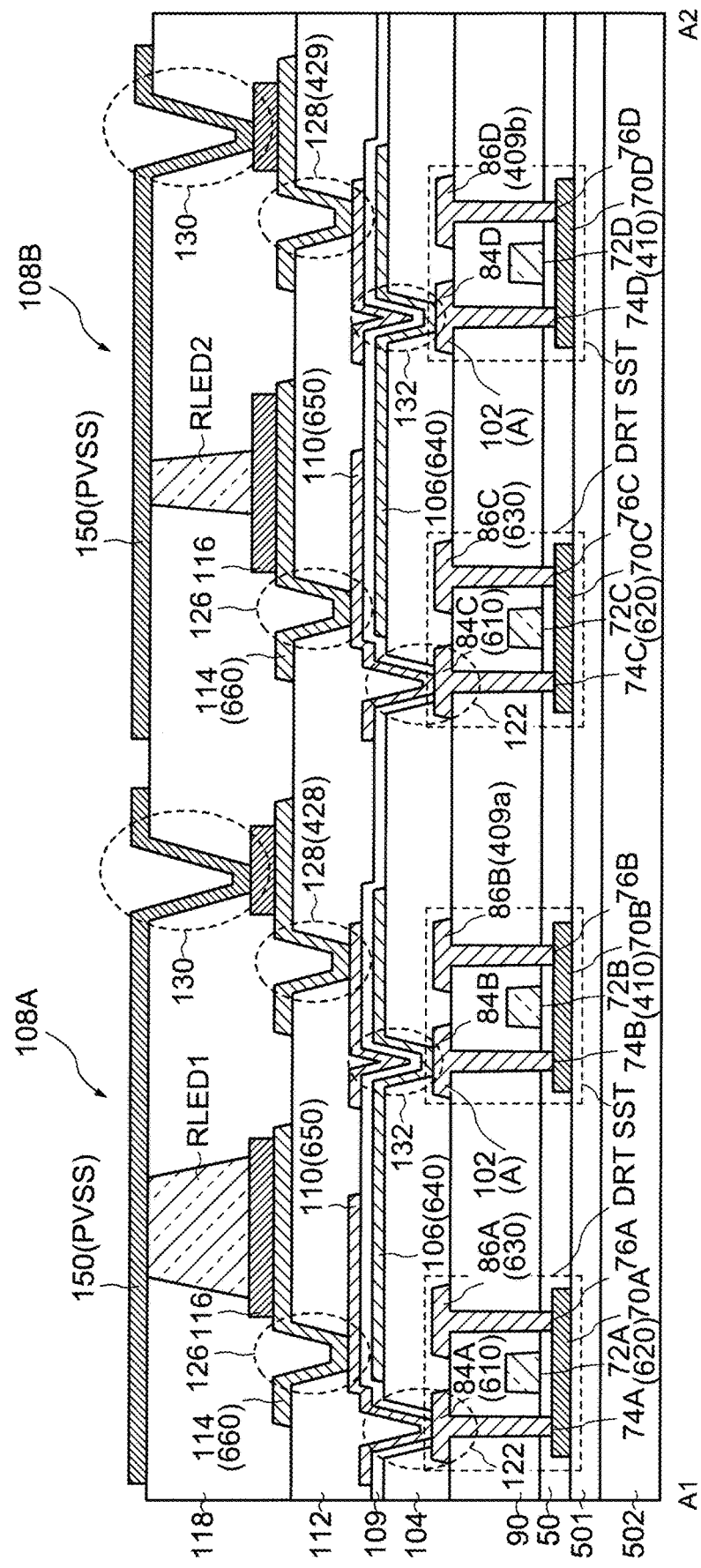
FIG. 14 is a schematic cross-sectional view showing a cross-section of a display device according to an embodiment.

FIG. 14 is a cross-sectional view showing an example of a cross-section of the display device 100 according to an embodiment. Specifically, FIG. 14 is a cross-sectional view along the cross-section of A1 and A2 of the sub-pixel 120A shown in FIG. 3. The cross-section shown in FIG. 14 is an example of a cross-section of the display device 100 according to an embodiment, wherein the cross-section of the display device 100 is not limited to that shown in FIG. 14. The same or similar components as those of FIGS. 1 to 13 will not be described here.

In the display device 100, semiconductor layers 70A, 70B, 70C, and 70D are provided on the upper surface of the substrate 502 via an under layer 501 having an arbitrary configuration.

The drive transistor DRT and the select transistor SST of the first light-emitting element driving unit 108A, the drive transistor DRT and the select transistor SST of the second light-emitting element driving unit 108B are provided on the under layer 501. The drive transistor DRT of the first light-emitting element driving unit 108A includes the semiconductor layer 70A, a gate insulating film 50, a gate electrode 72A (620), a source-electrode 84A (610), and a drain electrode 86A (630). The select transistor SST of the first light-emitting element driving unit 108A includes the semiconductor layer 70B, the gate insulating film 50, a gate electrode 72B (410), a source electrode 84B (the node A), and a drain electrode 86B (630).

The drive transistor DRT of the second light-emitting element driving unit 108B includes the semiconductor layer 70B, the gate insulating film 50, a gate electrode 72C (410), a source-electrode 84C (610), and a drain electrode 86C (630). The select transistor SST of the second light-emitting element driving unit 108B includes the semiconductor layer 70D, the gate insulating film 50, a gate electrode 72D (410), a source electrode 84D (the node A), and a drain electrode 86D (630). The source electrode or the source electrode drain electrode may be formed by injecting an impurity into the semiconductor layers 70A, 70B, 70C and 70D.

Each of the gate electrodes 72A, 72B, 72C, and 72D overlaps with the semiconductor layers 70A, 70B, 70C, and 70D with the gate insulating film 50 interposed therebetween. A region where the semiconductor layers overlap the gate electrodes is the channel region of each transistor. Each semiconductor layer may have source and drain regions to sandwich the channels region. An insulating film 90 is provided on the gate electrode.

Each of the source electrode 84A (610), the drain electrode 86A (630), the source electrode 84B (the node A), the drain electrode 86B (630), the source electrode 84C (610), the drain electrode 86C (630), the source electrode 84D (the node A), and the drain electrode 86D (630) is electrically connected to each of the semiconductor layers 70A, 70B, 70C, and 70D via openings 74A, 76A, 74B, 76B, 74C, 76C, 74D, and 76D exposing a part of the insulating film 90 or the gate insulating film. For example, the contact hole 208 is also one of the opening in which a part of the insulating film 90 or gate insulating film is exposed.

A first planarization layer 104 is provided on a first conductive layer 102. The first planarization layer 104 has an opening 122 that exposes a part of the first conductive layer 102. A second conductive layer 106, a first insulating layer 109, and a third conductive layer 110 are provided in this order on the first planarization layer 104. The first insulating layer 109 has the opening 122 that exposes a part of the first conductive layer 102. The third conductive layer 110 is electrically connected to the first conductive layer 102 via the opening 122.

A second planarization layer 112 is provided on the third conductive layer 110. The second planarization layer 112 has an opening 126 and an opening 128. In the opening 126 and the opening 128, a part of the third conductive layer 110 is exposed. A fourth conductive layer 114 and a fifth conductive layer 116 are provided on the second planarization layer 112 in this order. The fourth conductive layer 114 is electrically connected to the third conductive layer 110 via the opening 126. The fourth conductive layer 114 is electrically connected to the third conductive layer 110 via the opening 128.

A third planarization layer 118 is provided so that the first light-emitting element RLED1 and the second light-emitting element RLED2 are embedded in the third planarization layer 118. Although not shown, similar to the first light-emitting element RLED1 and the second light-emitting element RLED2, the first light-emitting element GLED1 and the second light-emitting element GLED2, and the first light-emitting element BLED1 and the second light-emitting element BLED2 are also provided so as to be embedded in the third planarization layer 118. The third planarization layer 118 has an opening 130 in which a part of the fifth conductive layer 116 is exposed. A sixth conductive layer 150 is provided on the third planarization layer 118 and is electrically connected to the fifth conductive layer 116 via an opening 140.

The insulating film 90 is provided on each transistor. The insulating film 90 has a function of absorbing unevenness caused by the transistor or other semiconductor element to provide a flat surface. As the insulating film 90, an organic compound material selected from acrylics, polyimides, and the like having excellent flatness of the film surface can be used.

The source electrode 84A (610), the drain electrode 86A (630), the source electrode 84B (the node A), the drain electrode 86B (630), the source electrode 84C (610), the drain electrode 86C (630), the source electrode 84D (the node A), the drain electrode 86D (630), the video signal lines 409a and 409b, the first drive power line PVDD1 and the second drive power line PVDD2, and the first electrode wiring 210 are provided on the first conductive layer 102. The first conductive layer 102 may be connected to the gate electrode 72A (620), the gate electrode 72B (410), the gate electrode 72C (410), and the gate insulating film 72D (410) by the opening in which a part of the insulating film 90 or gate electrode is exposed. The first wiring 206, the gate electrode 72A (620), the gate electrode 72B (410), the gate electrode 72C (410), and the gate electrode 72D (410) are provided on the side where the gate insulating film 50 is provided with respect to the first conductive layer 102. As the material of the first conductive layer 102, the first wiring 206, and each gate electrode, for example, a metal such as aluminum (Al), titanium (Ti), molybdenum (Mo), copper (Cu), or tungsten (W), or an alloy thereof can be used. The first conductive layer 102 can be a single layer or a laminated layer.

The second conductive layer 106 is provided with, for example, the first electrode 640 of the storage capacitor SC1 and the first electrode 640 of the storage capacitor SC2. As a material of the second conductive layer 106, for example, a transparent conductive material such as indium tin oxide (ITO) or indium zinc oxide (IZO) can be used.

The third conductive layer 110 may function as a wiring layer for connecting the first conductive layer 102 and the fourth conductive layer 114. For example, the second electrode 650 of the storage capacitor SC1 of the first light-emitting element driving unit 108A and the second electrode 650 of the storage capacitor SC2 of the second light-emitting element driving unit 108B are provided on the third conductive layer 110. As a material of the third conductive layer 110, for example, a metal such as aluminum (Al), titanium (Ti), molybdenum (Mo), copper (Cu), or tungsten (W), or an alloy thereof can be used. The first conductive layer 102 can be a single layer or a laminated layer.

The fourth conductive layer 114 may function as an electrode pad for implementing the first light-emitting element RLED1 and the second light-emitting element RLED2, the first light-emitting element GLED1 and the second light-emitting element GLED2, and the first light-emitting element BLD1 and the second light-emitting element BLD2. For example, the first electrode 660 of the first light-emitting element RLED1 and the first electrode 660 of the second light-emitting element RLED2 are provided on the fourth conductive layer 114. The fourth conductive layer 114 may function as a reflective layer that reflects light emitted from the first light-emitting element RLED1 and the second light-emitting element RLED2, the first light-emitting element GLED1 and the second light-emitting element GLED2, and the first light-emitting element BLD1 and the second light-emitting element BLD2. As the fourth conductive layer 114, for example, aluminum (Al), titanium (Ti), molybdenum (Mo), copper (Cu), or a metal such as tungsten (W), or an alloy thereof can be used. The first conductive layer 102 can be a single layer or a laminated layer.

The fifth conductive layer 116 may function as a bonding layer for bonding the first light-emitting element RLED1 and the second light-emitting element RLED2, the first light-emitting element GLED1 and the second light-emitting element GLED2, and the first light-emitting element BLD1 and the second light-emitting element BLD2. As the fifth conductive layer 116, for example, a silver-paste, solder, or an anisotropic conductive film (ACF) can be used.

The sixth conductive layer 150 may function as the first electrode 660 of the first light-emitting element RLED1 and the first electrode 660 of the second light-emitting element RLED2, the first electrode 660 of the first light-emitting element GLED1 and the first electrode 660 of the second light-emitting element GLED2, and the first electrode 660 of the first light-emitting element BLD1 and the first electrode 660 of the second light-emitting element BLD2, i.e. a wiring layer for routing the cathode electrodes. That is, the reference potential line PVSS which is connected to the cathode electrode or functions as the cathode electrode is provided on the sixth conductive layer 150. The sixth conductive layer 150 may function as a transmissive layer that transmits light emitted from the first light-emitting element RLED1 and the second light-emitting element RLED2, the first light-emitting element GLED1 and the second light-emitting element GLED2, and the first light-emitting element BLD1 and the second light-emitting element BLD2. As the sixth conductive layer 150, for example, a transparent conductive material such as indium tin oxide (ITO) or indium zinc oxide (IZO) can be used.

The first insulating layer 109 may separate and insulate the second conductive layer 106 and the third conductive layer 110. As the material of the first insulating layer 109, for example, an inorganic insulating material such as silicon oxide (SiO$_x$), silicon oxide nitride (SiO$_x$N$_y$), silicon nitride (SiN$_x$), silicon nitride oxide (SiN$_x$O$_y$), aluminum oxide (AlO$_x$), aluminum oxide nitride (AlO$_x$N$_y$), aluminum nitride oxide (AlN$_x$O$_y$), or aluminum nitride (AlN$_x$) can be used. In this case, SiO$_x$N$_y$ and AlO$_x$N$_y$ are a silicon compound and an aluminum compound that contain less amounts of nitrogen (N) than oxygen (O). SiN$_x$O$_y$ and AlN$_x$O$_y$ are a silicon compound and an aluminum compound that contain less amounts of oxygen than nitrogen. As the first insulating layer 109, not only an inorganic insulating material, but also an organic insulating material can be used. As the organic insulating material, for example, a polyimide resin, an acrylic resin, an epoxy resin, a silicone resin, a fluororesin, or a siloxane resin can be used. In the first insulating layer 109, the inorganic insulating layer material and the organic insulating material may be used alone or may be laminated.

The first planarization layer 104 and the second planarization layer 112 may flatten the unevenness of the layers located below each of them. The first planarization layer 104 may separate and insulate the current supply line 244 from other conductive layers. As a material of each of the first planarization layer 104 and the second planarization layer 112, for example, an organic resin such as a polyimide resin, an acrylic resin, an epoxy resin, a silicone resin, a fluororesin, or a siloxane resin can be used. Each of the first planarization layer 104 and the second planarization layer 112 may be formed using an organic resin alone or may be laminated.

The third planarization layer 118 may reduce and flatten the steps between the first light-emitting element RLED1 and the second light-emitting element RLED2, the first light-emitting element GLED1 and the second light-emitting element GLED2, and the first light-emitting element BLD1 and the second light-emitting element BLD2 in forming the sixth conductive layer. As a material of the third planarization layer 118, for example, a photosensitive organic material such as photosensitive acrylic or photosensitive polyimide can be used.

The display device according to an embodiment of the present disclosure may have a laminated structure described above. The display device according to an embodiment of the present disclosure has the above-described laminated structure and suppresses a decrease in long-term reliability of the display device.

Each of the embodiments described above as the embodiment of the present disclosure can be implemented in combination as appropriate if they do not conflict with each other. As long as the scope of the present disclosure is provided, it is also within the gist of the present disclosure that a person skilled in the art adds, deletes, or changes designs of the components, or adds, omits, or changes conditions of steps as appropriate based on the display device of the respective embodiments.

Even if it is other working effects which is different from the working effect brought about by the mode of each above-mentioned embodiment, what is clear from the description in this description, or what can be easily predicted by the person skilled in the art is naturally understood to be brought about by the one embodiment of the present invention.

What is claimed is:
1. A display device comprising:
a plurality of pixels arranged in a first direction and a second direction intersecting the first direction;
a plurality of sub-pixels included in each of the plurality of pixels;
a first LED chip included in one of the plurality of sub-pixels and emitting light at a first luminous intensity L1;
a second LED chip included in the one of sub-pixel and emitting light at a second luminous intensity L2;
a first wiring supplying a first voltage corresponding to the first luminous intensity L1 to the first LED chip; and
a second wiring supplying a second voltage corresponding to the second luminous intensity L2 to the second LED chip,
wherein
the first luminous intensity L1 of the first LED chip is calculated based on an equation (1) using a chip area S1 and a luminance EQEL1 of the first LED chip,

$$L1 = S1 \times EQEL1 \qquad (1),$$

the second luminous intensity L2 of the second LED chip is calculated based on an equation (2) using a chip area S2 and a luminance EQEL2 of the second LED chip, $$L2 = S2 \times EQEL2 \qquad (2),$$

the luminance EQEL1 is the luminance of the first LED chip when the first LED chip emits light at a current density maximizing an external quantum efficiency,
the luminance EQEL2 is the luminance of the second LED chip when the second LED chip emits light at a current density maximizing an external quantum efficiency,
the chip area S1 is a factorial of 2 of the chip area S2, and
the first voltage is different from the second voltage.
2. The display device according to claim 1, wherein
the chip area S1 is larger than the chip area S2, and the first voltage is larger than the second voltage.
3. The display device according to claim 1, wherein
a light emission color of the first LED chip is same as that of the second LED chip emit light.
4. The display device according to claim 1, wherein
a frame period in which the plurality of pixels emit light or does not emit light includes a first subframe period and a second subframe period,
during the frame period, a light emission or a non-light emission of the first LED chip and a light emission or a non-light emission of the second LED chip are controlled by a first control signal.
5. The display device according to claim 4, wherein
a time during which the first LED chip is emitting light or a time during which the first LED chip is not emitting light is controlled by a second control signal,
the time during which the first LED chip is emitting light or the time during which the first LED chip is not emitting light differs between the first subframe period and the second subframe period,
a time during which the second LED chip is emitting light or a time during which the second LED chip is not emitting light is controlled by a third control signal, and
the time during which the second LED chip is emitting light or the time during which the second LED chip differs between the first subframe period and the second subframe period.
6. The display device according to claim 5, wherein
each of the first LED chip and the second LED chip has a first electrode and a second electrode, and
a voltage supplied to the first electrode of the first LED chip is different from a voltage supplied to the first electrode of the second LED chip.

7. The display device according to claim 6, wherein
the one of the plurality of sub-pixels has a first capacitance and a second capacitance,
a first electrode of the first capacitance is connected to the first electrode of the first LED chip,
a first electrode of the second capacitance is connected to the first electrode of the second LED chip,
the second electrode of the first LED chip is connected to the second electrode of the second LED chip, and
a voltage supplied to the second electrode of the first LED chip is same as a voltage supplied to the second electrode of the second LED chip.

* * * * *